US007639416B2

(12) United States Patent
Meisburger

(10) Patent No.: US 7,639,416 B2
(45) Date of Patent: Dec. 29, 2009

(54) APPARATUS FOR SLM-BASED OPTICAL LITHOGRAPHY WITH GRAY LEVEL CAPABILITY

(75) Inventor: William Daniel Meisburger, San Jose, CA (US)

(73) Assignee: Maskless Lithography, Inc., San Jose, CA (US)

( * ) Notice: Subject to any disclaimer, the term of this patent is extended or adjusted under 35 U.S.C. 154(b) by 239 days.

(21) Appl. No.: 11/923,399

(22) Filed: Oct. 24, 2007

(65) Prior Publication Data

US 2009/0086182 A1    Apr. 2, 2009

Related U.S. Application Data

(60) Continuation of application No. 10/941,969, filed on Sep. 14, 2004, now Pat. No. 7,295,362, which is a division of application No. 10/646,525, filed on Aug. 21, 2003, now Pat. No. 7,167,296.

(60) Provisional application No. 60/406,030, filed on Aug. 24, 2002.

(51) Int. Cl.
*G02B 26/00*   (2006.01)
*G02B 26/08*   (2006.01)
*G02F 1/29*    (2006.01)
*G03B 27/72*   (2006.01)
*G03B 27/70*   (2006.01)

(52) U.S. Cl. .................. 359/290; 359/291; 359/298; 355/35; 355/67

(58) Field of Classification Search ................ 359/290, 359/291, 298; 355/35, 67
See application file for complete search history.

(56) References Cited

U.S. PATENT DOCUMENTS 4,571,603 A    2/1986   Hornbeck et al.
4,879,605 A    11/1989  Warkentin et al.

(Continued)

FOREIGN PATENT DOCUMENTS

WO    WO 03/52516 A1    6/2003

OTHER PUBLICATIONS

"New Architecture for Laser Pattern Generators for 130 NM and Beyond," Ulric Ljungblad, Tor Sandström, Hans Buhre, Peter Dürr, Hubert Lakner, 20th Annual Bacus Symposium on Photomask Technology, Brian J. Grenon, and Giang T. Dao, Editors, Proceedings of the SPIE, vol. 4186, 2001.

*Primary Examiner*—Ricky L Mack
*Assistant Examiner*—Brandi N Thomas
(74) *Attorney, Agent, or Firm*—Schneck & Schneck

(57) ABSTRACT

An optical lithography system comprises a light source, a spatial light modulator, imaging optics and means for continuously moving a photosensitive substrate relative to the spatial light modulator. The spatial light modulator comprises at least one array of individually switchable elements. The spatial light modulator is continuously illuminated and an image of the spatial light modulator is continuously projected on the substrate; consequently, the image is constantly moving across the surface of the substrate. While the image is moving across the surface, elements of the spatial light modulator are switched such that a pixel on the surface of the substrate receives, in serial, doses of energy from multiple elements of the spatial light modulator, thus forming a latent image on the substrate surface. The imaging optics is configured to project a blurred image of the spatial light modulator on the substrate, enabling sub-pixel resolution feature edge placement.

24 Claims, 35 Drawing Sheets

U.S. PATENT DOCUMENTS

| | | | |
|---|---|---|---|
| 5,049,901 A | 9/1991 | Gelbart | |
| 5,132,723 A | 7/1992 | Gelbart | |
| 5,330,878 A | 7/1994 | Nelson | |
| 5,455,602 A | 10/1995 | Tew | |
| 5,459,492 A | 10/1995 | Venkateswar | |
| 5,461,411 A | 10/1995 | Florence et al. | |
| 5,482,818 A | 1/1996 | Nelson | |
| 5,490,009 A | 2/1996 | Venkateswar et al. | |
| 5,504,629 A | 4/1996 | Lim | |
| 5,523,193 A | 6/1996 | Nelson | |
| 5,672,464 A | 9/1997 | Nelson | |
| 5,691,541 A | 11/1997 | Ceglio et al. | |
| 5,870,176 A | 2/1999 | Sweatt et al. | |
| 6,124,876 A | 9/2000 | Sunagawa | |
| 6,130,750 A | 10/2000 | Ausschnitt et al. | |
| 6,204,875 B1 | 3/2001 | De Loor et al. | |
| 6,229,649 B1 | 5/2001 | Woods et al. | |
| 6,251,550 B1 | 6/2001 | Ishikawa | |
| 6,271,957 B1 | 8/2001 | Quate et al. | |
| 6,285,488 B1 | 9/2001 | Sandstrom | |
| 6,288,830 B1 | 9/2001 | Kinoshita | |
| 6,295,153 B1 | 9/2001 | Garner | |
| 6,312,134 B1 | 11/2001 | Jain et al. | |
| 6,375,903 B1 | 4/2002 | Cerrina et al. | |
| 6,379,867 B1 | 4/2002 | Mei et al. | |
| 6,399,261 B1 | 6/2002 | Sandstrom | |
| 6,411,366 B2 | 6/2002 | Luellau et al. | |
| 6,421,573 B1 | 7/2002 | Kafka et al. | |
| 6,425,669 B1 | 7/2002 | Mei et al. | |
| 6,428,940 B1 | 8/2002 | Sandstrom | |
| 6,473,237 B2 | 10/2002 | Mei | |
| 6,480,324 B2 | 11/2002 | Quate et al. | |
| 6,493,867 B1 | 12/2002 | Mei et al. | |
| 6,504,644 B1 | 1/2003 | Sandstrom | |
| 6,509,955 B2 | 1/2003 | Mei et al. | |
| 6,537,738 B1 | 3/2003 | Mei et al. | |
| 6,552,779 B2 | 4/2003 | Mei et al. | |
| 6,567,205 B2 | 5/2003 | Eggers et al. | |
| 6,581,070 B1 | 6/2003 | Gibbon et al. | |
| 6,590,632 B2 | 7/2003 | Sumi | |
| 6,637,329 B1 | 10/2003 | Madeley | |
| 6,665,121 B2 | 12/2003 | Gelbart et al. | |
| 6,717,650 B2 | 4/2004 | Jain | |
| 6,965,364 B1 | 11/2005 | Eggers et al. | |
| 2002/0080339 A1 | 6/2002 | Takahashi | |
| 2003/0184730 A1 | 10/2003 | Price | |

US 7,639,416 B2

APPARATUS FOR SLM-BASED OPTICAL LITHOGRAPHY WITH GRAY LEVEL CAPABILITY

CROSS-REFERENCE TO RELATED APPLICATIONS

This application is a continuation of U.S. Non-Provisional application Ser. No. 10/941,969 filed Sep. 14, 2004 now U.S. Pat. No. 7,295,362, which in turn is a divisional of U.S. Non-Provisional application Ser. No. 10/646,525 filed Aug. 21, 2003 now U.S. Pat. No. 7,167,296, which claims the benefit of U.S. Provisional application Ser. No. 60/406,030 filed Aug. 24, 2002, incorporated in its entirety by reference herein.

BACKGROUND OF THE INVENTION

1. Field of the Invention

This invention relates to the field of optical lithography, and in particular to printing patterns on the following substrates: wafers; printed circuit boards; flat panel displays; masks; reticles; and plates used for the reproduction of magazines, newspapers and books.

2. Description of the Related Art

The semiconductor industry uses very expensive stepper tools for lithographic processing. Furthermore, very expensive reticles are used in this processing—the cost of the reticles is sufficient to make low volume production of chips (such as custom ASICs) prohibitively expensive. The semiconductor industry needs a lower cost lithography process. Furthermore, every time the lithography pattern changes, several days or more are required to produce a new reticle. The semiconductor industry needs a lithography process which can quickly accommodate pattern changes.

The printed circuit board (PCB) industry has similar problems with its lithography processes. Furthermore, the substrates used in the PCB industry undergo distortion during fabrication which limits the use of high resolution lithography processing to small area substrates and the use of steppers. A high resolution lithographic process is required for large PCB substrates in which the pattern can be quickly and economically adjusted to accommodate the distortions, where the distortions vary from one substrate to the next.

U.S. Pat. Nos. 5,330,878 5,523,193 5,482,818 and 5,672, 464 to Nelson describe a method and apparatus for patterning a substrate. The apparatus uses a spatial light modulator (SLM), specifically the Texas Instruments deformable mirror device (DMD), in place of a reticle. The DMD is an array of individually controllable reflective elements. An image of the DMD is projected on the substrate by an imaging lens. Whether or not an individual element of the DMD reflects light into the imaging lens, such that it is projected on the substrate, is determined by computer; thus the pattern projected on the substrate is computer controlled and readily changed. Improvements are required to this approach in order to meet the high resolution and throughput requirements of both the semiconductor and PCB industries. Furthermore, advancements are available to reduce the cost of the apparatus, while increasing the throughput and meeting the high resolution requirements.

SUMMARY OF THE INVENTION

The present invention provides an apparatus and method for patterning photosensitive substrates. The apparatus includes a spatial light modulator (SLM), a light source for illuminating the SLM, imaging optics for projecting an image of the SLM on the substrate, and means for moving the image across the surface of the substrate. The SLM controls the pattern of light which reaches the substrate. The SLM comprises at least one array of individually switchable elements—switchable between two or more states. The SLM can be either a diffractive or a transmissive device. The light source can be a continuous light source, such as an arc lamp, LED or continuous laser; quasi-continuous lasers can also be used when the laser pulsing frequency is much higher than the switching frequency of the elements of the SLM. The means for moving the image can be a stage on which either the SLM or the substrate is mounted. When the substrate is in the form of a flexible film or similar, it may be moved using a reel to reel mechanism. While the image is moving across the surface of the substrate, elements of the spatial light modulator are switched such that a pixel on the surface of the substrate receives, in serial, doses of energy from multiple elements of the spatial light modulator, thus forming a latent image on the substrate surface. The imaging optics can be telecentric.

In preferred embodiments the imaging optics is configured to project a blurred image of the spatial light modulator on the substrate, enabling sub-pixel resolution feature edge placement. The blurring can be implemented by: adjusting the focus of the imaging optics; adjusting the numerical aperture of the imaging optics; adding a diffuser between the SLM and the substrate; adding a microlens array between the SLM and the substrate; or a combination of the aforementioned.

In preferred embodiments the spatial light modulator is continuously illuminated, an image of the spatial light modulator is continuously projected on the substrate, and the image is continuously moved across the surface of the substrate.

In some embodiments the SLM comprises a multiplicity of area arrays. The corresponding imaging optics can be a single projection lens system, or a multiplicity of projection lens systems. In the case of the latter, the number of the area arrays is greater than the number of the projection lens systems, and the number of projection lens systems is preferably a submultiple of the number of area arrays. Furthermore, the multiplicity of area arrays can be arranged in a line, or they can be arranged in multiple lines where the placement of the arrays is staggered from one line to another. The latter may utilize more of the imaging field of the projection optics, and can also result in a more efficient exposure of the substrate—reducing the need for a serpentine motion of the projected image of the SLM across the substrate during exposure.

DETAILED DESCRIPTION

Figure 1:
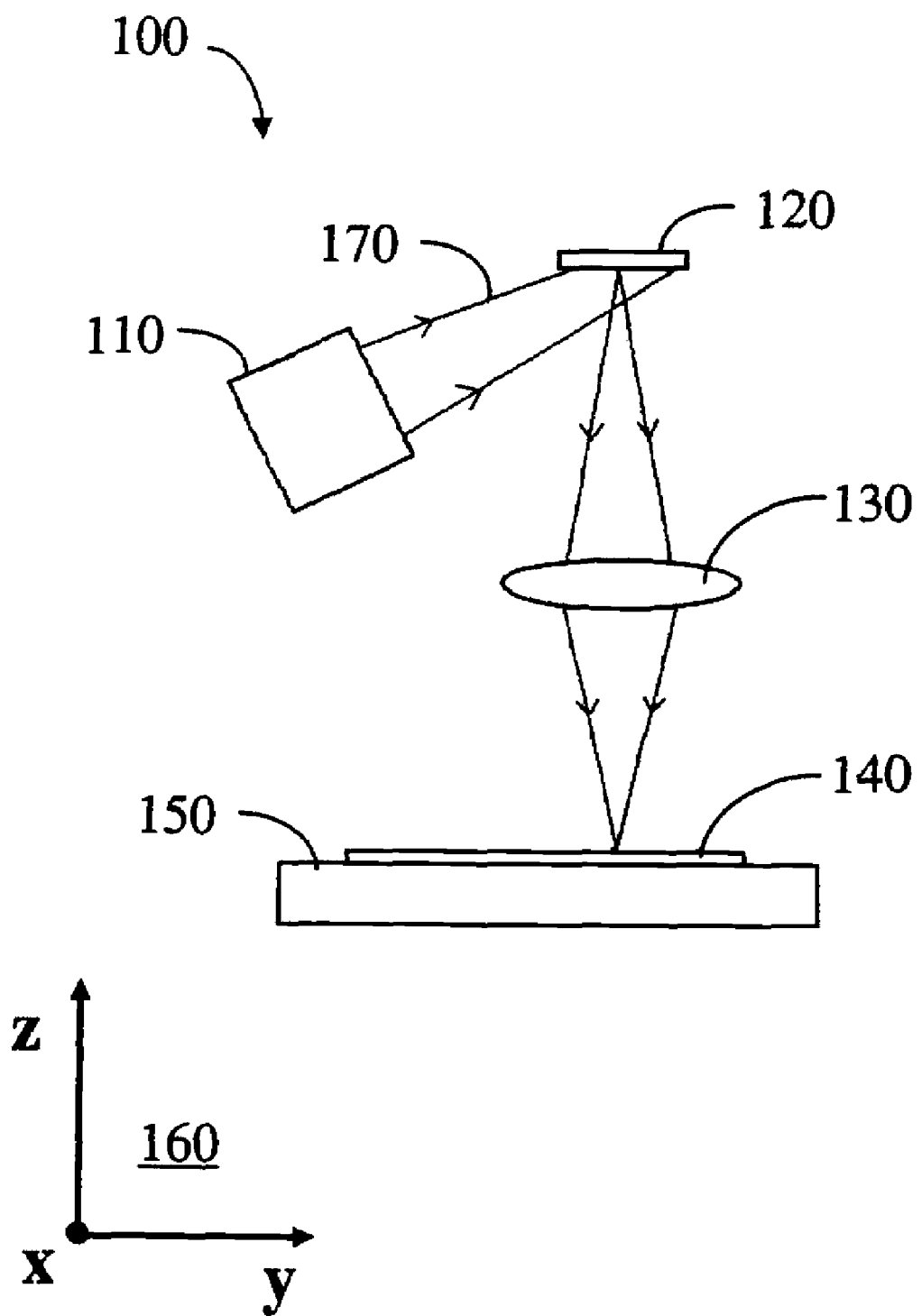
FIG. 1 is a schematic representation of an optical lithography tool with a movable substrate, in accordance with the invention.

With reference to FIG. 1, optical lithography tool 100, which is an embodiment of the invention suitable for patterning a substrate 140 mounted on a movable stage 150, is shown with a light source 110, a spatial light modulator (SLM) 120 and imaging optics 130. Coordinate axes 160 are shown with the z and y axes in the plane of the figure and the x axis perpendicular to the plane of the figure. The light path through the optical lithography tool is represented by rays 170. The light source 110 continuously illuminates the SLM 120. The light source may comprise an arc lamp, continuous laser (solid state or gas), light emitting diode (LED) or other type of continuous light source that has suitable spectral properties for exposure of the substrate 140. Furthermore, a light source such as a quasi-continuous laser (a laser which is pulsed at MHz frequencies), may be suitable as a light source for this invention—a critical criteria is that the pulsing frequency be much higher than the switching frequency for elements of the spatial light modulator (typically $10^4$ Hz); in this case the illumination of the SLM by the light source is effectively continuous. The light source may also comprise optical components for increasing the intensity of illumination and to improve illumination uniformity. These may include an elliptical mirror, both round and cylindrical lenses, and light pipes or fly's eye lens arrays. SLM 120 is one or more area arrays (generally rectangular) of elements that act on the light beam from the light source. An image of the SLM is continuously projected onto the substrate by the imaging optics 130, which is also referred to as the projection optics. The elements can be individually switched between two or more states, under computer control, so as to control the light amplitude in the image. One embodiment of the invention includes an SLM which is an array of mirrors or diffractive elements that can switch incoming light rays between two or more angular states. A digital micro-mirror device (DMD), currently available from Texas Instruments, is an example of a suitable mirror-array that can switch between two angular states. An example of a diffractive SLM is the Grating Light Valve (GLV) currently manufactured by Silicon Light Machines. Other embodiments of the invention include SLMs which are Liquid Crystal Display (LCD) devices. If the elements of the SLM are transmissive, rather than reflective, then the optics will need to be rearranged; such a rearrangement will be obvious to those skilled in the art. Imaging lens system 130 may contain both reflective and refractive elements, and is typically telecentric. Substrate 140 either includes a photosensitive layer, such as a photoresist coating, or is itself a photosensitive material, such as a sheet of photosensitive polyimide. The stage 150 may be of a roller-bearing or air-bearing design and may have height adjustment (in z-direction), tilt and rotation capabilities. These types of stages are well know and commonly used in lithography systems. For simplicity of illustration the substrate is assumed to be planar. However, the invention will also work with other substrate shapes, such as cylindrical or spherical, along with a rotary rather than a planar stage.

Figure 2:
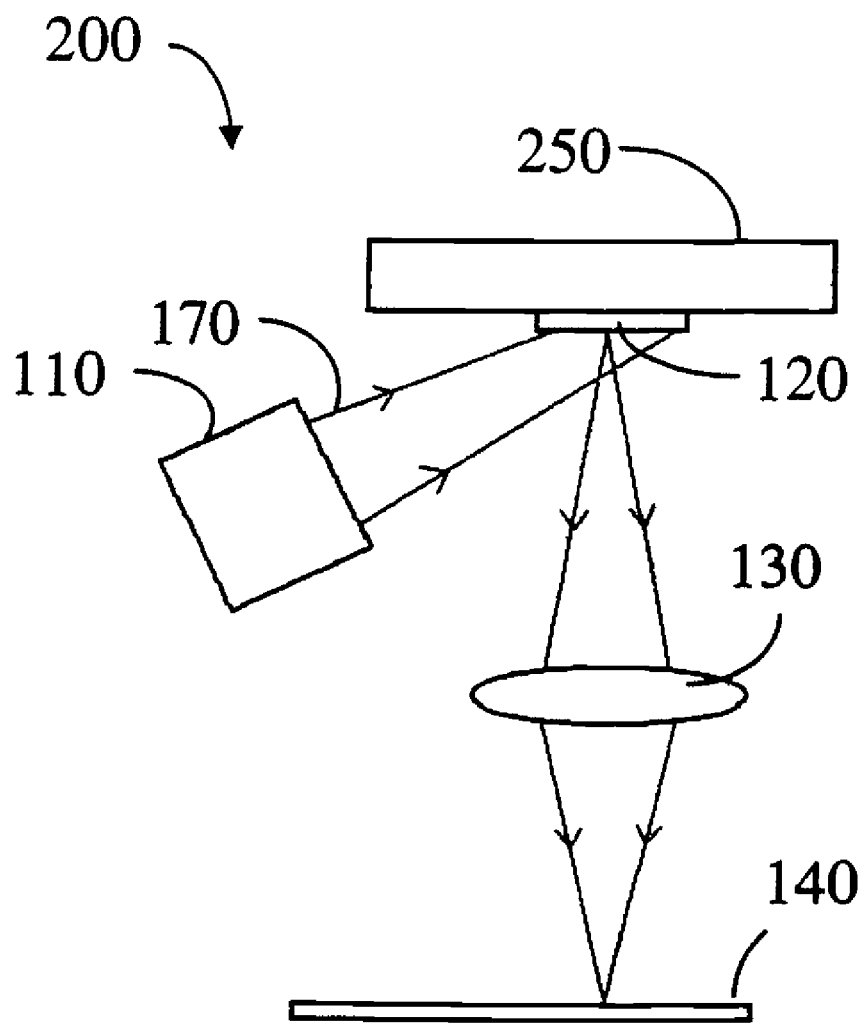
FIG. 2 is a schematic representation of an optical lithography tool with a movable spatial light modulator, in accordance with the invention.
Figure 2:
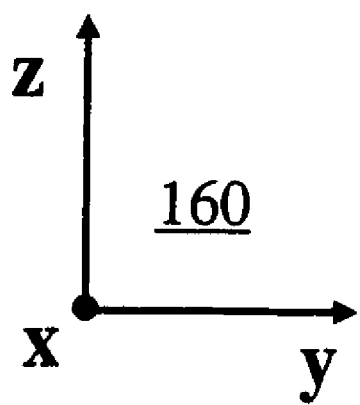

With reference to FIG. 2, optical lithography tool 200, which is an embodiment of the invention suitable for patterning a static substrate 140, is shown with a light source 110, SLM 120, a stage 250 on which the SLM is mounted, and projection optics 130. The method of operation is the same as for optical lithography system 100, described above, except that stage 250 moves SLM 120 during exposure while substrate 140 is stationary. Imaging lens system 130 and/or illumination source 110 can also be attached to the stage 250 and move with the SLM.

Figure 3:
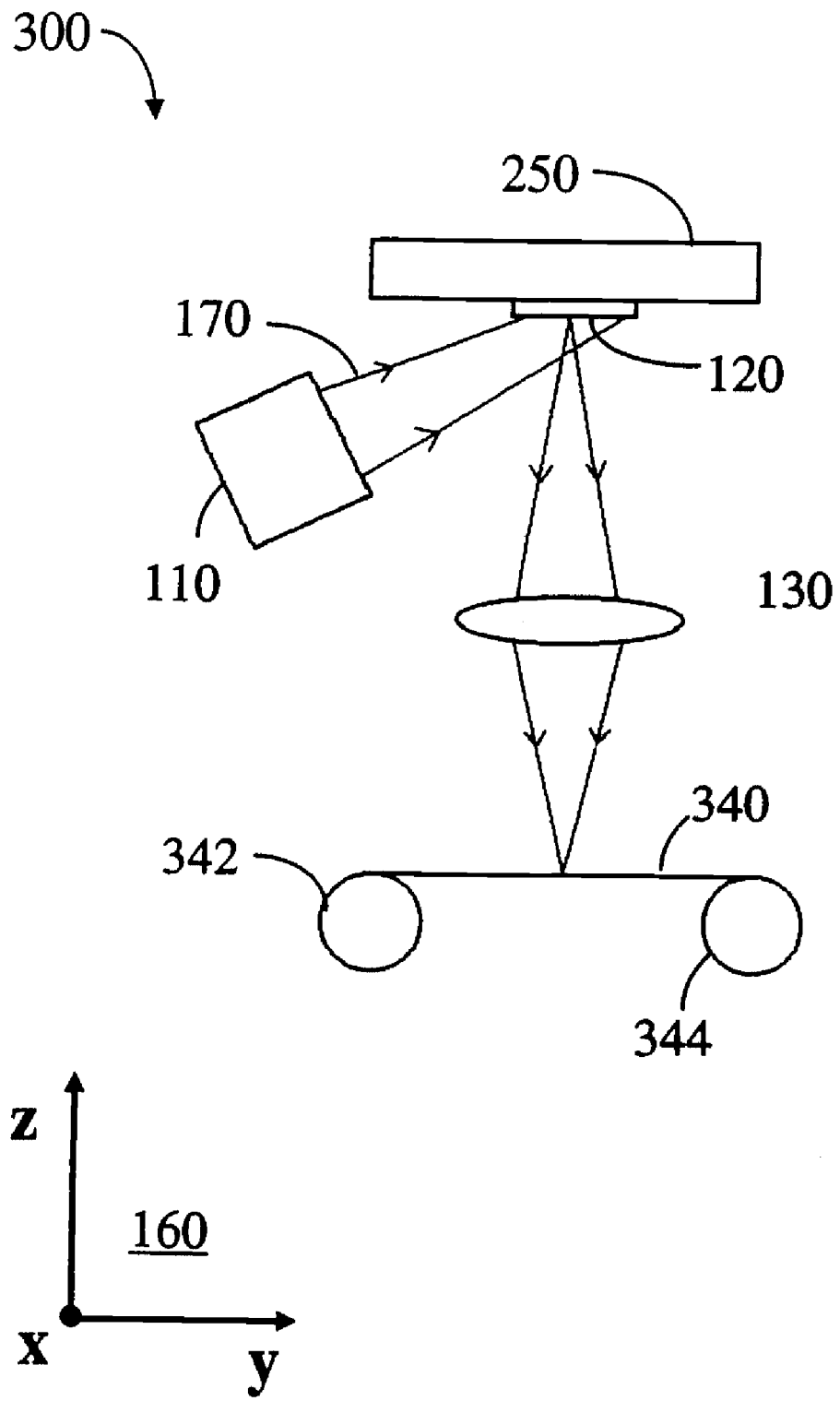
FIG. 3 is a schematic representation of an optical lithography tool with a flexible film substrate, in accordance with the invention.

With reference to FIG. 3, optical lithography tool 300, which is an embodiment of the invention suitable for patterning a flexible substrate 340, is shown with a light source 110, SLM 120, a stage 250 on which the SLM is mounted, projection optics 130, and rotatable, spaced apart, axially parallel film drums 342 and 344. The photosensitive flexible film substrate 340 is wrapped around and tensioned between film drums 342 and 344 such that the film can be moved in the y direction (referenced to stationary coordinate system 160). Two modes of exposure are possible. In the first mode, stage 250 moves the SLM at constant speed in the x direction while the substrate 340 is stationary. When an exposure pass is complete (for example, the edge of the substrate is reached), the film drums index the substrate forward in the y direction and the stage reverses direction for the next exposure pass. The result is a serpentine exposure path similar to path 850 shown in FIG. 8, and discussed in more detail below. In the second mode the roles of the stage and film drums are reversed. While the stage is stationary, the film drums move the substrate at constant speed in the y direction until the edge of the exposure region is reached. The stage then indexes the substrate forward in the x direction and the film drums reverse direction for the next exposure pass. Again, this results in a serpentine exposure path. Furthermore, if the width of the area to be exposed on the substrate is less than or equal to the width of the projected image of the SLM, then the stage can remain stationary, or be eliminated, and the film drums move the substrate at a constant speed, without the need to reverse direction. As in other embodiments, the projection optics may be carried on the stage.

Figure 4:
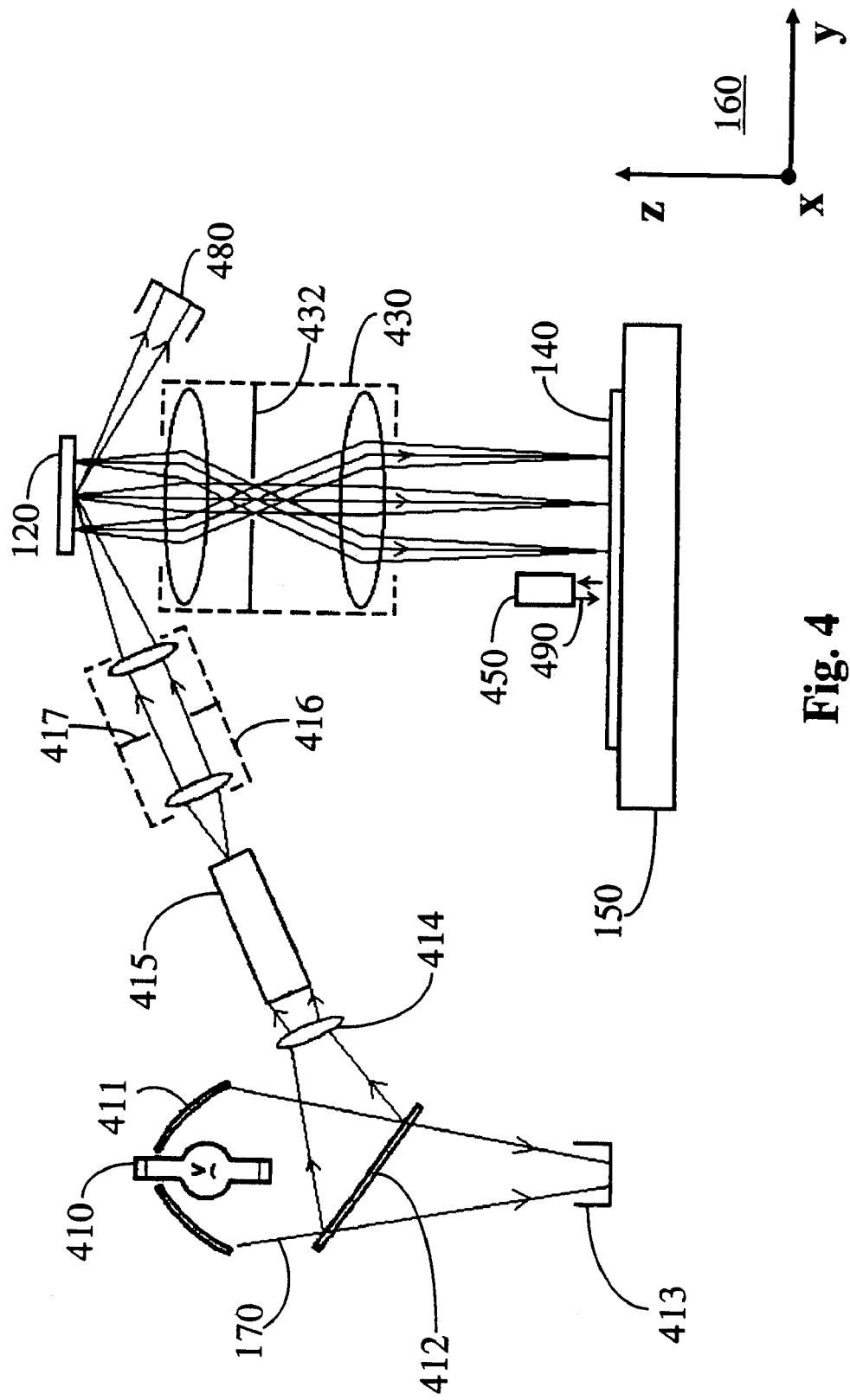
FIG. 4 is a detailed schematic representation of a first embodiment of the optical lithography tool of FIG. 1, showing telecentric projection optics.
Figure 5:
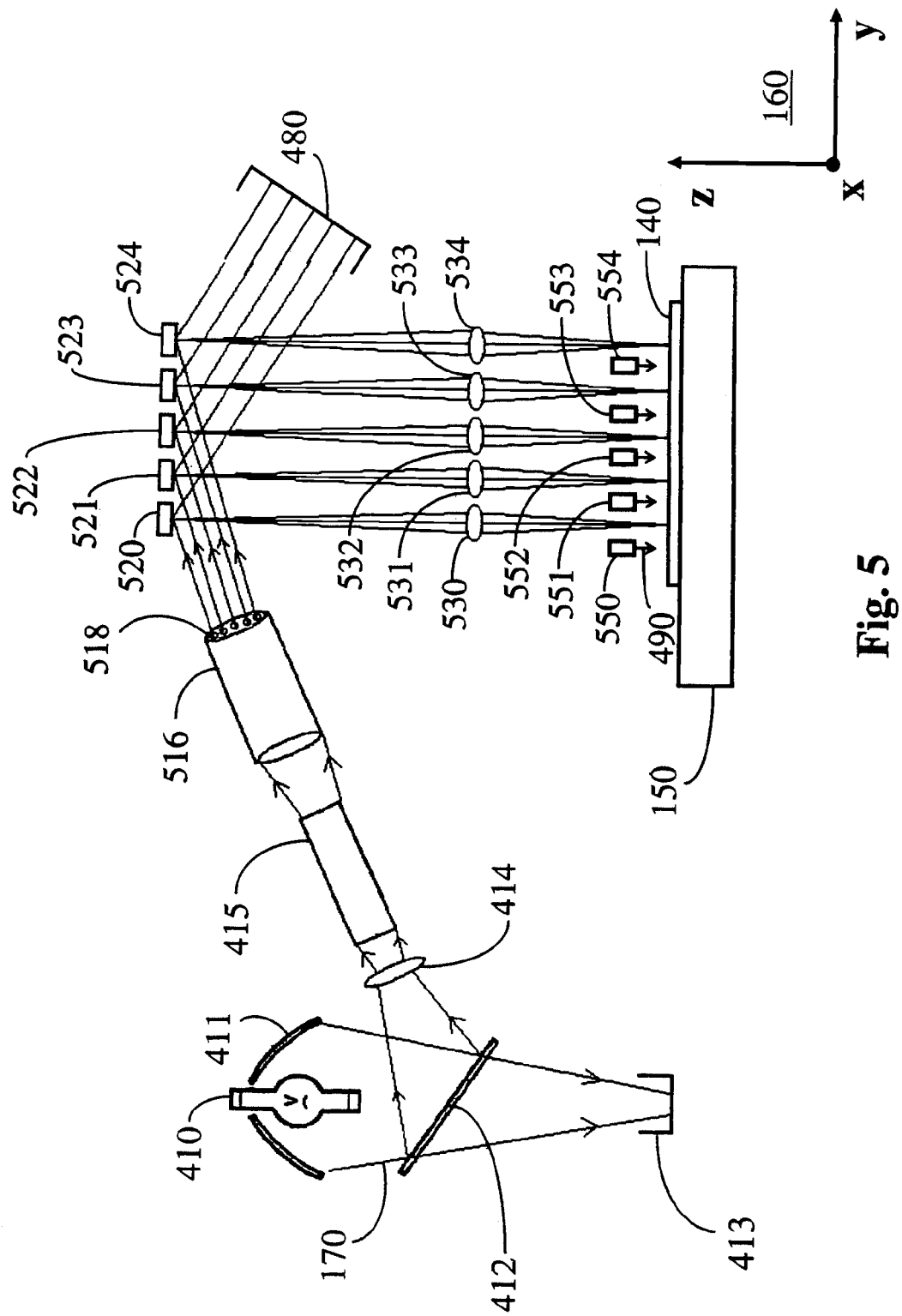
FIG. 5 is a detailed schematic representation of a second embodiment of the optical lithography tool of FIG. 1, showing a spatial light modulator with multiple area arrays and corresponding multiple sets of projection optics.
Figure 6:
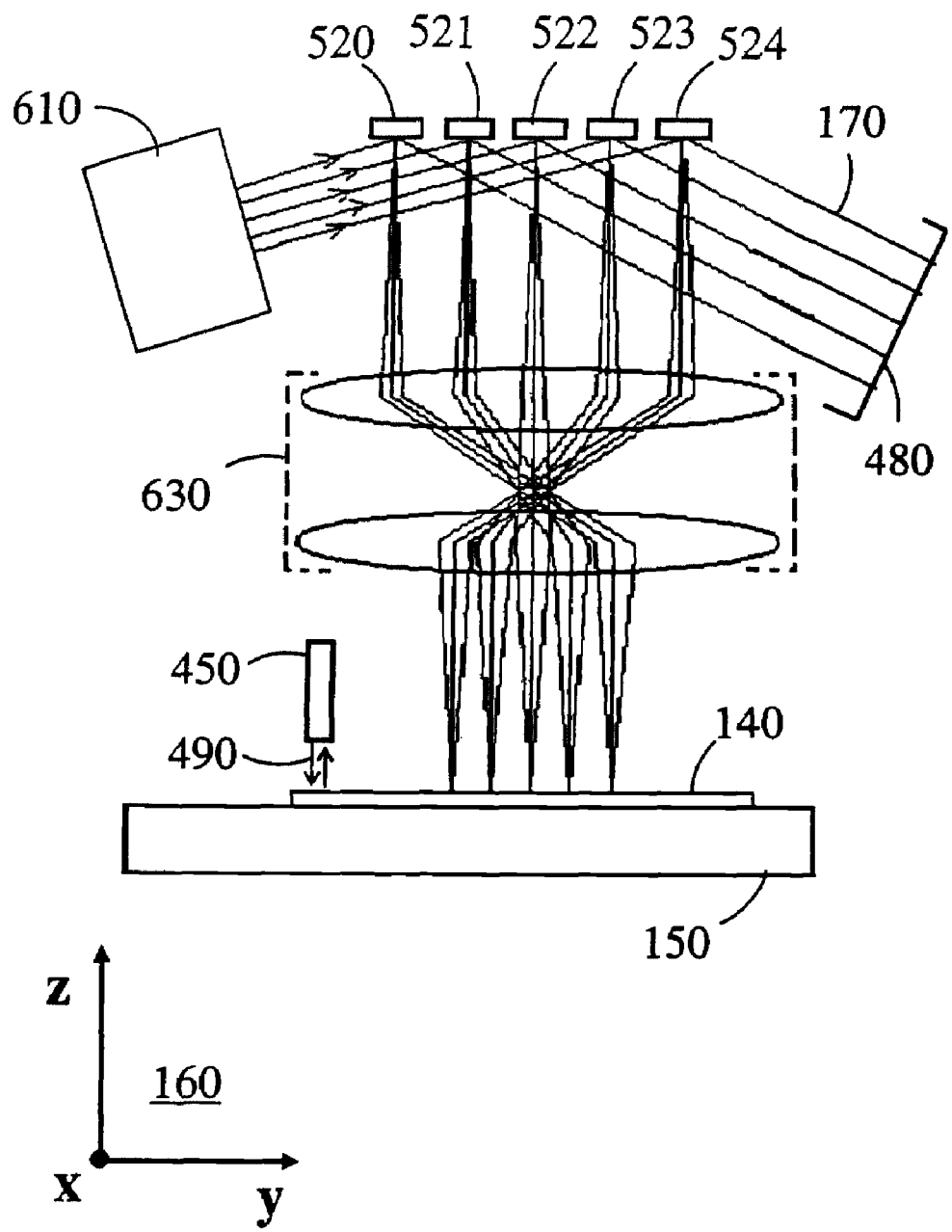
FIG. 6 is a detailed schematic representation of a third embodiment of the optical lithography tool of FIG. 1, showing a spatial light modulator with multiple area arrays and a single set of telecentric projection optics.

Referring to FIGS. 4, 5 and 6, different embodiments of optical lithography tool 100 (see FIG. 1) are shown in detail.

FIG. 4 is a schematic of a continuous direct-write optical lithography system with an arc lamp and a telecentric projection lens system. Continuous illumination from mercury arc lamp 410 is reflected from elliptical reflector 411. Reflected light, as represented by light rays 170, travels to a dichroic mirror 412, which reflects wavelengths useful for exposure of the substrate 140 (for example 350 nm-450 nm) and is transparent to other wavelengths. Light not reflected from the dichroic mirror is absorbed in illumination beam dump 413. Other types of lamps can be used, such as a Xenon arc lamp, depending on the exposure wavelengths and source brightness needed. A light pipe 415 is used to improve the illumination uniformity, but could be replaced with a fly's eye lens array. A light pipe lens system 414, positioned before the light pipe 415, is used to adjust the numerical aperture of the illumination system and to adjust the diameter of the light beam prior to entering the light pipe. Condenser lens system 416 captures light exiting from the light pipe and modifies the beam shape and angle to match the requirements of the SLM 120. The condenser lens system contains an illumination aperture 417. The light pipe lens system and condenser lens system are usually anomorphic and contain cylindrical lens elements. The continuous illumination mercury arc lamp, elliptical reflector, dichroic mirror, illumination beam dump, light pipe lens system, light pipe, condenser lens system and illumination aperture comprise an embodiment of illumination source 110, as shown in FIG. 1. The SLM is one or more area arrays (generally rectangular) of small mirrors that can switch between two or more angular states under computer control. At least one of the angular states reflects light rays from the illumination source into a telecentric projection lens system 430 and at least one other angular state reflects light rays into an SLM beam dump 480. A digital micro-mirror device (DMD), currently available from Texas Instruments, is an example of a suitable mirror-array that can switch between two angular states. Mirrors in the "on" state in the SLM are imaged on the substrate by the telecentric projection lens system. Light reflected from mirrors in the SLM in the "off" state travels to the SLM beam dump where it is absorbed. Further details of the operation of a SLM are provided below and in FIG. 7. The substrate either contains a photosensitive layer, such as a photoresist coating, or is itself a photosensitive material, such as a sheet of photosensitive polyimide. The substrate is attached to stage 150, which moves continuously during exposure in straight-line segments in the x-y plane of stationary coordinate system 160. The numerical aperture of the telecentric projection lens system is determined by a projection lens aperture 432, which is optically conjugate to illumination aperture 417. A double telecentric projection lens system is shown. However, a single telecentric or non-telecentric projection system will also work. A telecentric design is preferred because the magnification does not change with substrate height, which simplifies calibration of the lithography tool for each substrate. The telecentric projection lens system is a type of projection lens system 130, as shown in FIG. 1. The stage can move in a plane x-y and also in the z direction of the stationary coordinate system 160. The stage 150 can also have rotation and tilt capability; this may be required for proper substrate alignment (for example, when substrate flatness is an issue). Movement in the z direction will either focus or defocus the projected image on the substrate. A substrate height measuring system 450, utilizing height detection medium 490, can be used to determine the z position of the surface of the substrate 140. The height measuring system can be optical, capacitance or air based. The preferred type is air. Focusing can also be accomplished by moving either the SLM or projection lens system in the z direction.

FIG. 5 is a schematic of a continuous direct-write optical lithography system with an arc lamp, an SLM with multiple area arrays, and multiple projection lens systems. The light source is arranged as described above for FIG. 4, except that a condenser lens system 516 and lens array 518 capture light exiting from light pipe 415, so as to modify the beam shape and angle to match the requirements of the individual SLM area arrays 520 through 524. The lens array maximizes the light intensity on the individual SLM area arrays; the lens array is configured to match the arrangement of the SLM area arrays, which may be arranged in a line, multiple lines (see FIG. 29), or some other two dimensional arrangement. While not an essential component, incorporation of the lens array is preferred. The lens array may comprise lenses arranged correspondingly with the SLM area arrays; alternatively, the lenses in the lens array may be replaced with one or more diffractive elements. Light pipe lens system 414 and condenser lens system 516 are usually anomorphic and contain cylindrical lens elements. The continuous illumination mercury arc lamp 410, elliptical reflector 411, dichroic mirror 412, illumination beam dump 413, light pipe lens system 414, light pipe 415, condenser lens system 516 and lens array 518 comprise a type of continuous illumination source 110 as in FIG. 1. Each individual SLM area array 520 through 524 is a rectangular array of small mirrors that can switch between two or more angular states under computer control. A digital micro-mirror device (DMD) currently available from Texas Instruments is an example of a suitable mirror-array that can switch between two angular states. Mirrors in the "on" state in SLM area array 520 are imaged on the substrate 140 by projection lens 530; likewise for SLM area arrays 521 through 524 and their corresponding projection lenses 531 through 534. Light reflected from mirrors in SLM area array 520 in the "off" state travels to SLM beam dump 480 where it is absorbed; likewise for SLM area arrays 521 through 524. Five each SLM area arrays (520 through 524), projection lenses (530 through 534) and substrate height measuring systems (550 through 554) are shown in this example, but any number may be used. The projection lenses may contain both reflective and refractive elements, and are typically telecentric. The projection lens systems (any one of 530 through 534) may be the same as the projection optics 130 in FIG. 1. Substrate 140 either contains a photosensitive layer, such as a photoresist coating, or is itself a photosensitive material, such as a sheet of photosensitive polyimide. The substrate is attached to stage 150, which moves continuously during exposure in straight-line segments in the x-y plane of stationary coordinate system 160. As in other embodiments, the imaging optics may be carried on the stage.

FIG. 6 is a schematic of a continuous direct-write optical lithography system with a single telecentric objective lens system and a SLM with multiple area arrays. The light source 610 is the same as the light source described in FIG. 5, and is configured so as to provide illumination to match the requirements of the individual SLM area arrays 520 through 524. Each individual SLM area array is one or more rectangular arrays of small mirrors that can switch between two or more angular states under computer control. A digital micro-mirror device (DMD) currently available from Texas Instruments is an example of a suitable mirror-array that can switch between two angular states. Mirrors in the "on" state in the SLM area arrays are imaged on the substrate 140 by telecentric projection lens system 630. Light reflected from mirrors in the SLM area arrays in the "off" state travels to SLM beam dump 480 where it is absorbed. Five SLM area arrays are shown in this example but any number may be used. A double telecentric projection lens system 630 is shown. However, a single telecentric or non-telecentric projection system can also be used. A telecentric design is preferred because the magnification does not change with substrate height, which simplifies calibration of the lithography tool for each substrate. The telecentric projection lens system is a type of projection lens system 130, as in FIG. 1. The stage can move in a plane x-y and also in the z direction of the stationary coordinate system 160. The stage 150 can also have rotation and tilt capability; this may be required for proper substrate alignment (for example, when substrate flatness is an issue). Movement in the z direction will either focus or defocus the projected image on the substrate. A substrate height measuring system 450 can be used to determine the z position of the surface of the substrate 140. The height measuring system can be optical, capacitance or air based. The preferred type is air. Focusing can also be accomplished by moving either the SLM area arrays 520 through 524 or telecentric projection lens system 630 in the z direction. Substrate 140 either contains a photosensitive layer, such as a photoresist coating, or is itself a photosensitive material, such as a sheet of photosensitive polyimide.

Further to the lithography systems of FIGS. 5 & 6, other embodiments of the invention are envisaged which combine a SLM having multiple area arrays with a submultiple number of projection lens systems. For example, a lithography system may have 6 SLM area arrays and 2 projection lens systems, such that each projection lens system images 3 different SLM area arrays at once. Furthermore, the number of projection lens systems need not be limited to a mathematical submultiple—for example, a lithography system may have 7 SLM area arrays and 2 projection lens systems, such that a first projection lens system images 3 SLM area arrays and a second projection lens system images the remaining 4 SLM area arrays. The configuration of these embodiments will be apparent to those skilled in the art. Clearly, there are very many further combinations of SLM area arrays and projection lens systems which follow this teaching and will be apparent to those skilled in the art.

Figure 7:
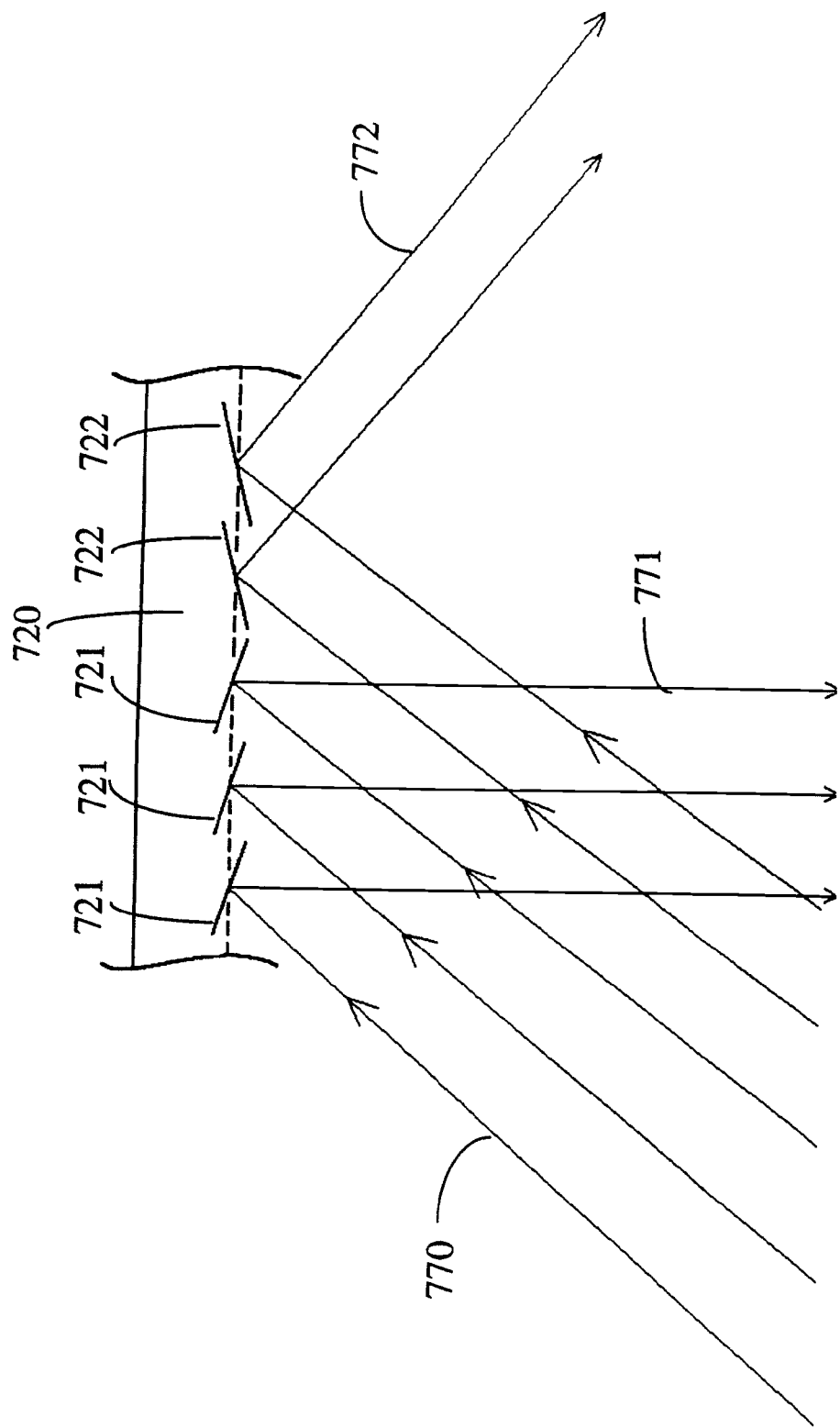
FIG. 7 is a diagrammatic cross-sectional view through part of a micro-mirror array in accordance with the invention, showing array elements in 'on' and 'off' positions.

With reference to FIG. 7, a partial cross-section of a SLM 720 is shown. Mirrors 721 are shown in the 'on' position and mirrors 722 are shown in the 'off' position. Light rays 770 are reflected off the surface of the mirrors 721, which are in the 'on' position, toward a substrate (rays 771) and are reflected off the surface of mirrors 722, which are in the 'off' position, toward a beam stop (rays 772). For example, referring to both FIGS. 4 and 7, rays 771 travel through projection lens system 430 and then to the substrate 140, whereas the rays 772 fall outside the acceptance aperture of projection lens system 430 and are collected by beamstop 480. This is the preferred mode of operation, although, other modes of operation may be considered. For example, the rays 772 could fall partly within the acceptance aperture of projection lens system 430, consequently an attenuated signal from the "off" state mirrors would reach the substrate, which may be tolerable.

Figure 8:
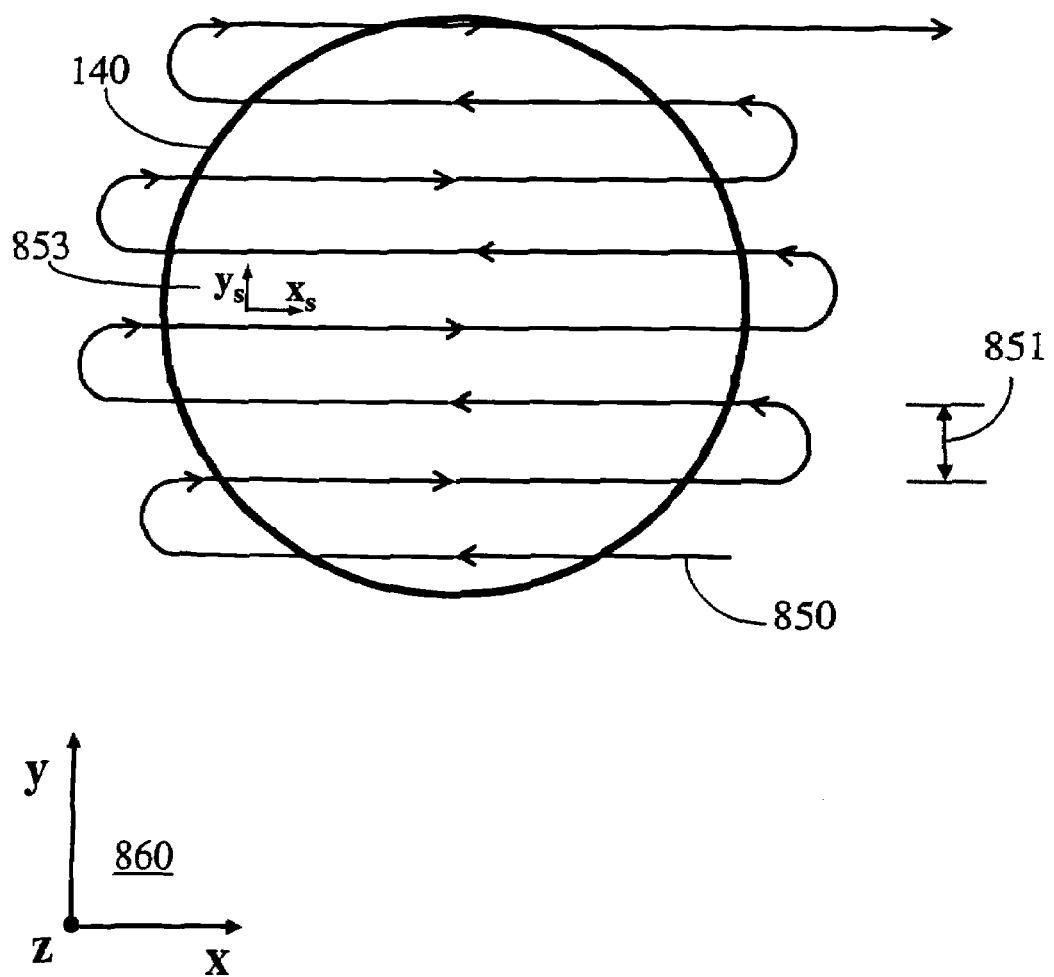
FIG. 8 is a plan view of a substrate showing a serpentine path that can be followed by the projected image of a spatial light modulator in order to expose the entire substrate surface, in accordance with the invention.

With reference to FIG. 8, an example is shown of a serpentine path 850 that can be followed by the projected image of a SLM in order to expose the entire surface of the substrate 140. The motion of the image is due to an image movement mechanism. The substrate or the SLM can be mounted on the image movement mechanism. An example of a suitable mechanism is a stage, such as shown in FIGS. 1, 2 and 3. In the case of a flexible substrate a suitable mechanism is a pair of rotatable, spaced apart, axially parallel film drums, such as shown in FIG. 3. In the explanation that follows a configuration of the lithography system in which the substrate is mounted on a stage is assumed. The following are shown: substrate 140, serpentine path 850, distance between straight line segments on the path 851, substrate coordinate system 853 and stationary coordinate system 860. The SLM is oriented in such a way that the columns of pixels in the projected image on the substrate are parallel to the straight-line segment portions of the serpentine path, which, for ease of illustration, are parallel to the x-axis of stationary coordinate system 860. A stage positions the substrate 140 such that the center of the projected image of the SLM is at the beginning of path 850. In this example, at the beginning of path 850 none of the projected image of the SLM falls on the substrate 140. As the stage moves in the +x direction, referenced to stationary coordinate system 860, the center of the projected image of the SLM moves in the $-x_s$ direction, referenced to substrate coordinate system 853, and traces the first straight section of the serpentine path. The exposure starts when the projected image of the SLM falls on the substrate. The exposure stops after the projected image clears the edge of the substrate. The stage then repositions the substrate in readiness to scan in the −x direction along the second straight section of the path, which is separated from the first straight section by a distance 851 in the y direction, all referenced to stationary coordinate system 860. This is repeated until the entire substrate is exposed. Clearly, the projected width of the SLM must be greater than or equal to the distance 851 in order to expose the complete substrate. If only certain regions of the substrate need to be exposed, then it may be more efficient to execute a serpentine pattern for each individual region. Although a serpentine path is preferred, other paths could be used as long as they contained straight-line segments for the exposure. It will be clear to those skilled in the art that a serpentine path can also be achieved with a lithography system configuration in which the SLM is mounted on a stage and the substrate is static.

Figure 9:
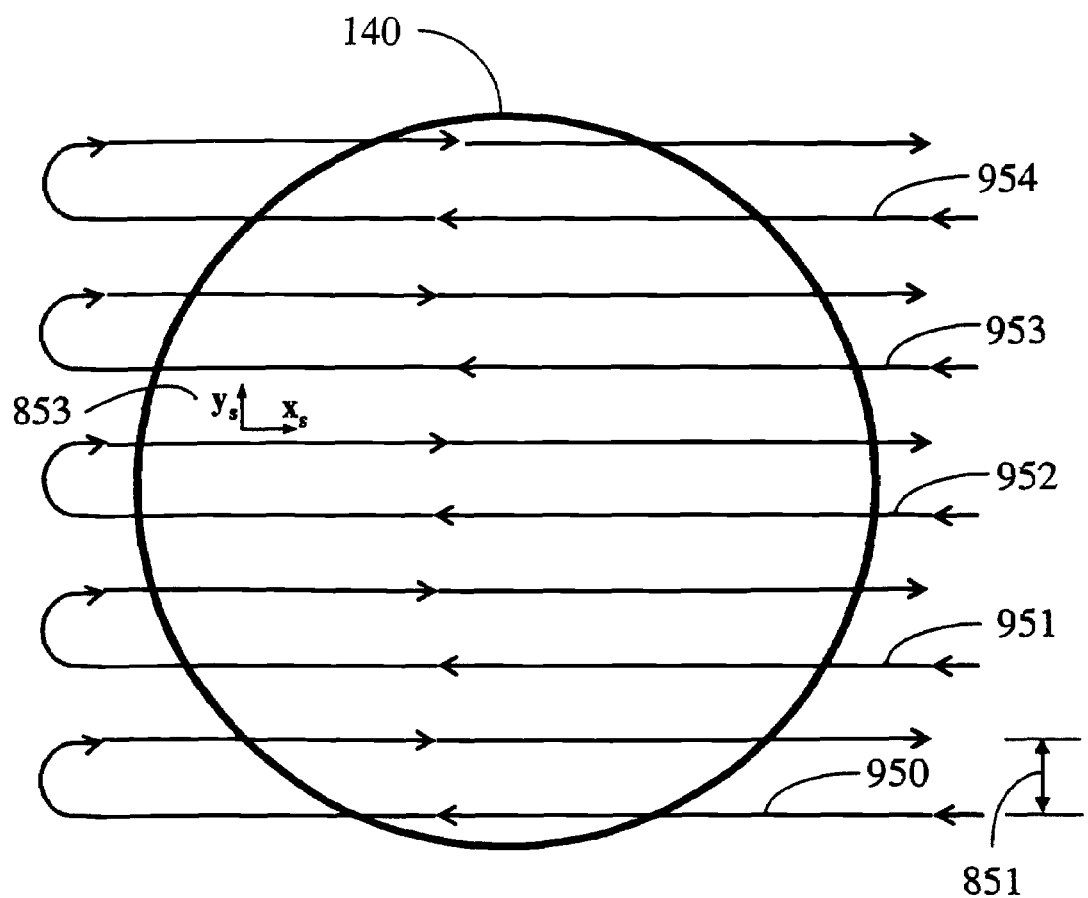
FIG. 9 is a plan view of a substrate showing serpentine paths that can be followed by projected images from each of a multiplicity of area arrays that are used together to expose the entire substrate surface, in accordance with the invention.
Figure 9:
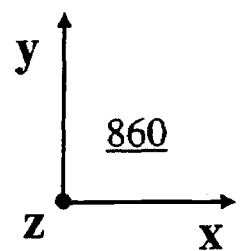

With reference to FIG. 9, an example is shown of a set of serpentine paths 950 through 954 that can be followed by the projected images of a corresponding set of SLM area arrays in order to expose the entire surface of the substrate 140. The motion of the image is due to an image movement mechanism. The substrate or the SLM can be mounted on the image movement mechanism. An example of a suitable mechanism is a stage, such as shown in FIGS. 1, 2 and 3. In the case of a flexible substrate a suitable mechanism is a pair of rotatable, spaced apart, axially parallel film drums, such as shown in FIG. 3. In the explanation that follows a configuration of the lithography system in which the substrate is mounted on a stage is assumed. Each SLM area array is oriented in such a way that the columns of pixels in the projected image on the substrate 140 are parallel to the straight-line segment portions of the serpentine path, which for ease of illustration, are parallel to the x-axis of stationary coordinate system 860. A stage positions the substrate 140 such that the centers of the projected images of the SLM area arrays are at the beginning of paths 950 through 954. In this example, at the beginning of paths 950 through 954 none of the projected images of the SLM arrays fall on the substrate 140. As the stage moves in the +x direction, referenced to stationary coordinate system 860, the center of the projected images of the SLM area arrays move in the $-x_s$ direction, referenced to substrate coordinate system 853, and trace the first straight sections of the serpentine paths. The exposure along any path starts when the projected image of the SLM area array falls on the substrate. The exposure stops along any path after the projected image clears the edge of the substrate. After all exposures have stopped, the stage then repositions the substrate in readiness to scan in the −x direction along the second straight section of the path, which is separated from the first straight section by a distance 851 in the y direction, all referenced to stationary coordinate system 860. If this does not cover the entire substrate, then the stage moves in the y direction, referenced to stationary coordinate system 860, by the distance between paths 950 and 954, and the above procedure is repeated. Clearly, the projected width of the SLM arrays must be greater than or equal to the distance 851 in order to expose the complete substrate. Note that in this example the separation between consecutive paths 950, 951, . . . 954 is twice the spacing 851; should the separation exceed twice the spacing 851, then a serpentine motion with more straight sections can be employed. This explanation is relevant to the multiple SLM area array lithography systems of FIGS. 5 & 6, for which paths 950 through 954 correspond to SLM area arrays 520 through 524.

Referring to FIGS. 1 and 8, patterns of elements in the "on" state that correspond to features printed on substrate 140 must shift across the SLM 120 in such a way that they appear stationary, on average, to the constantly moving substrate. If the stage 150 is moving at constant speed v along one of the straight-line segments of serpentine path 850 (the stage is moving in a patterning direction), then this is accomplished by shifting the SLM pattern by one row at regular time intervals, where the time interval T is given by:

$$T = \frac{pM}{v} \tag{1}$$

where p is the row pitch of the elements (the Texas Instruments DMD mirrors have the same pitch for rows and columns) and M is the magnification of the projection lens system 130. As an example, the Texas Instruments DMD is available with a mirror pitch of 13.7 microns and the minimum mirror cycle time is 102 microseconds. If the projection lens system 130 has a magnification of 2.0, then the stage speed is approximately 269 mm/s. If the dose delivered is inadequate to expose the substrate or the stage speed required is beyond the capability of the stage system, then the actual mirror cycle time used may need to be longer. However, the mirror cycle time and stage speed must always satisfy equation (1).

Figure 10:
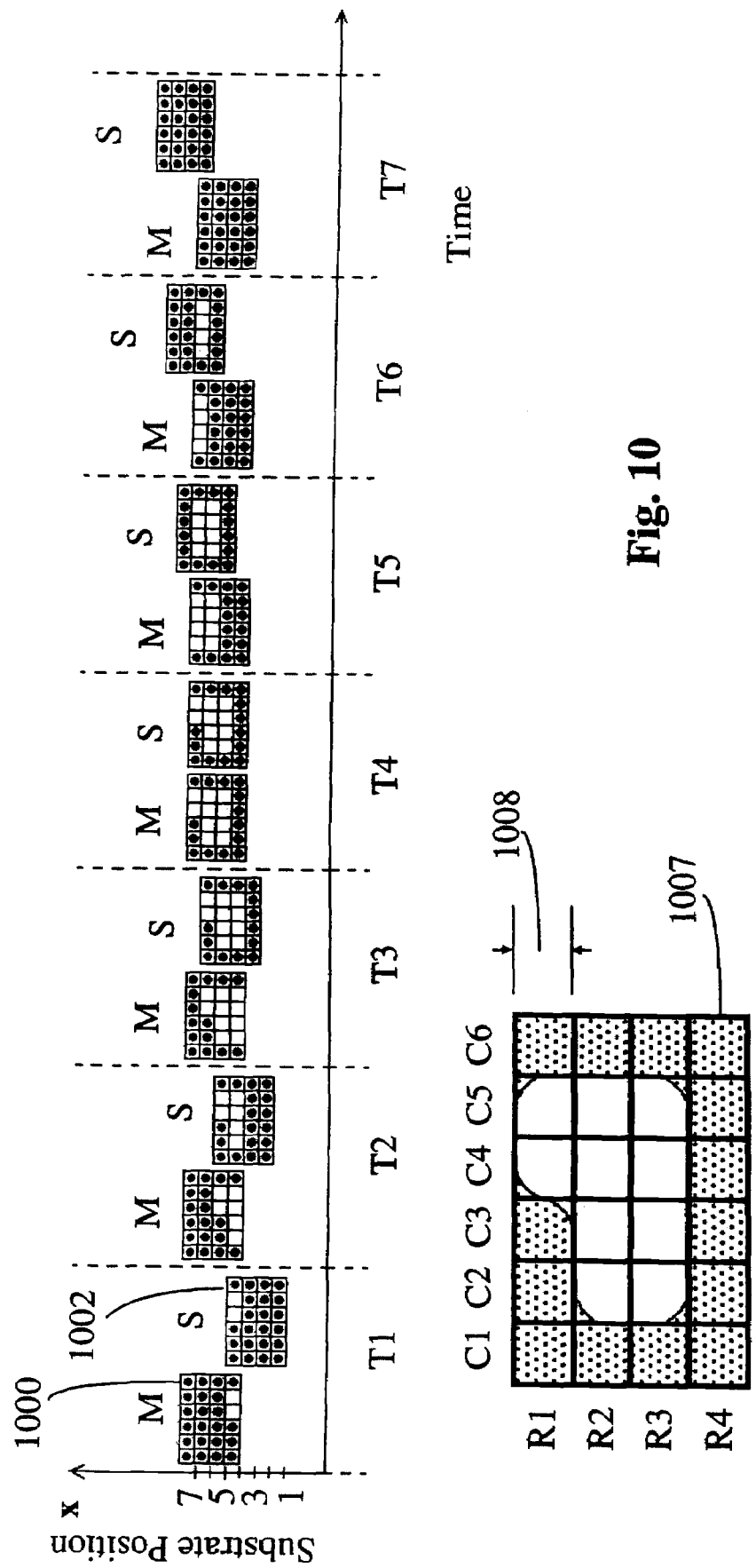
FIG. 10 is a diagrammatic representation of the process of forming a latent image, in accordance with the invention.

FIG. 10 illustrates the shifting of patterns on the SLM and the corresponding image on the substrate. In this example, the substrate is on a stage and moves at constant speed in the x direction during exposures. The following are shown, with reference also to FIG. 1: part of SLM 120, which is an array of elements 1000 with an area of 4 rows by 6 columns; a corresponding part of substrate 140, which is an array of pixels 1002 with an area of 4 rows by 6 columns; resultant image 1007 with projected row pitch (width of a pixel) 1008. The resultant image shows one possible latent image on the substrate due to completion of the entire series of exposures. The edge placement and corner rounding in a latent image will be discussed in detail below. "Snapshots" of the corresponding parts of the SLM and substrate are shown at equally spaced times T1 through T7, where the time interval satisfies equation (1); the parts of the SLM and substrate are indicated in the figure by M and S, respectively. The SLM array 1000, the substrate array 1002 and the resultant image 1007 are drawn as if viewed from a position directly above them and looking down in the −z direction of stationary coordinate system 160. For ease of illustration, in each "snapshot" the SLM and substrate arrays are shown next to each other. The projected row pitch 1008 in the resultant image 1007 is the row pitch in the SLM array 1000 times the magnification of the projection lens system 130. However, for ease of illustration, in each "snapshot" the SLM and substrate arrays are shown having the same size and orientation. The grid shown on the arrays 1000 and 1002, and the image 1007 is for reference only. A light square in 1000 corresponds to an SLM element in the "on" state, while a dark square corresponds to one in the "off" state. The light and dark areas in 1002 correspond to the states of the SLM elements for that "snapshot". For example, at time T1 the substrate is receiving light at pixels located at R1C4 and R1C5 from mirrors in the SLM array at positions R4C4 and R4C5 (where the nomenclature R1C4 represents the pixel/element at row R1 and column C4). At time T1 the bottom edge of the substrate array 1002 is aligned with substrate position coordinate 1. At time T2 the substrate has moved by one row and the bottom edge of the substrate is now aligned with substrate position coordinate 2. The time elapsed between T2 and T1 satisfies equation (1). The particular feature pattern used as an example in FIG. 10 is shown in its entirety at time T4 on both the SLM and the substrate arrays. It can be seen that the edge of this feature pattern first appears at T1, scrolls across the SLM array 1000 between times T2 and T6 and has moved off the SLM array 1000 by T7. On the substrate array 1002, the feature pattern does not appear to move. This can be most clearly seen at times T3 and T4. However, because the substrate is moving at constant speed while the SLM is stationary, the projected pattern does in fact move on the substrate by the projected row pitch 1008 between any two consecutive snapshot times. Note that for ease of illustration the patterns shown on the substrate arrays 1002 do not show any blurring or optical interference effects.

Figure 11:
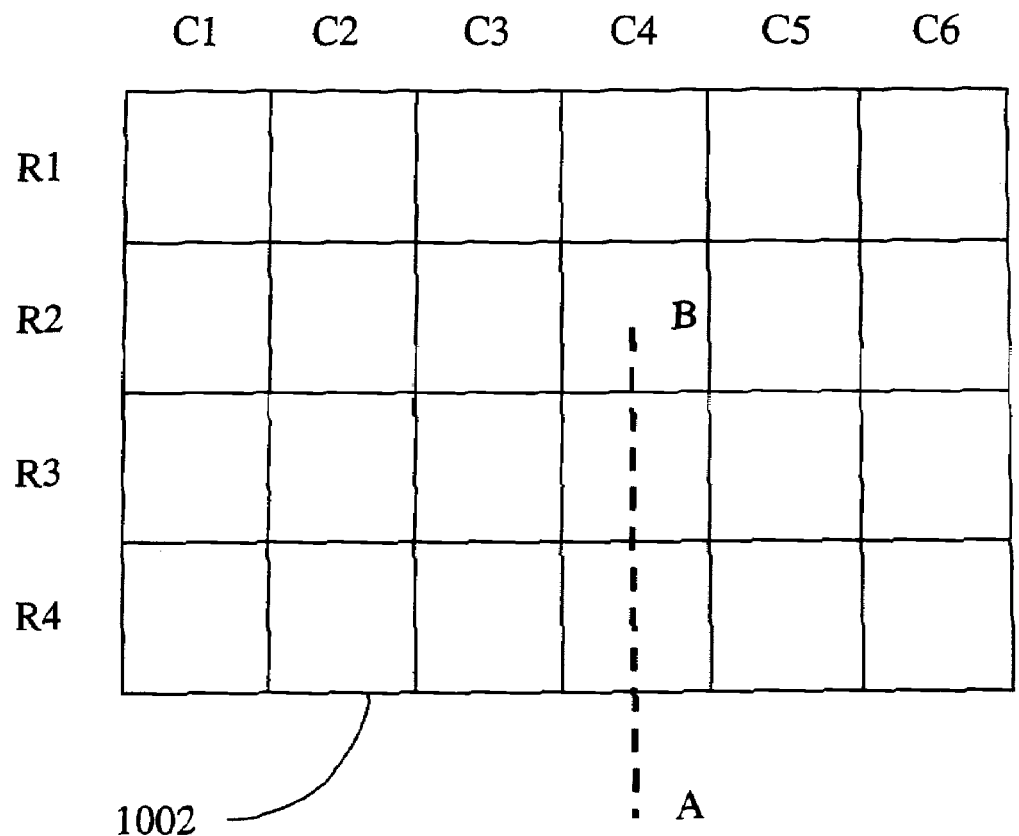
FIG. 11 is a diagrammatic representation of the substrate array of FIG. 10.

FIG. 11 shows the substrate array 1002 with a line segment AB positioned in the center of column C4. Light intensity and resultant dose profiles will be determined on the surface of the substrate array in the position indicated by line segment AB. Note that the position of AB is such that it crosses the "trailing edge" of the exposure pattern shown in FIG. 10.

Figure 12:
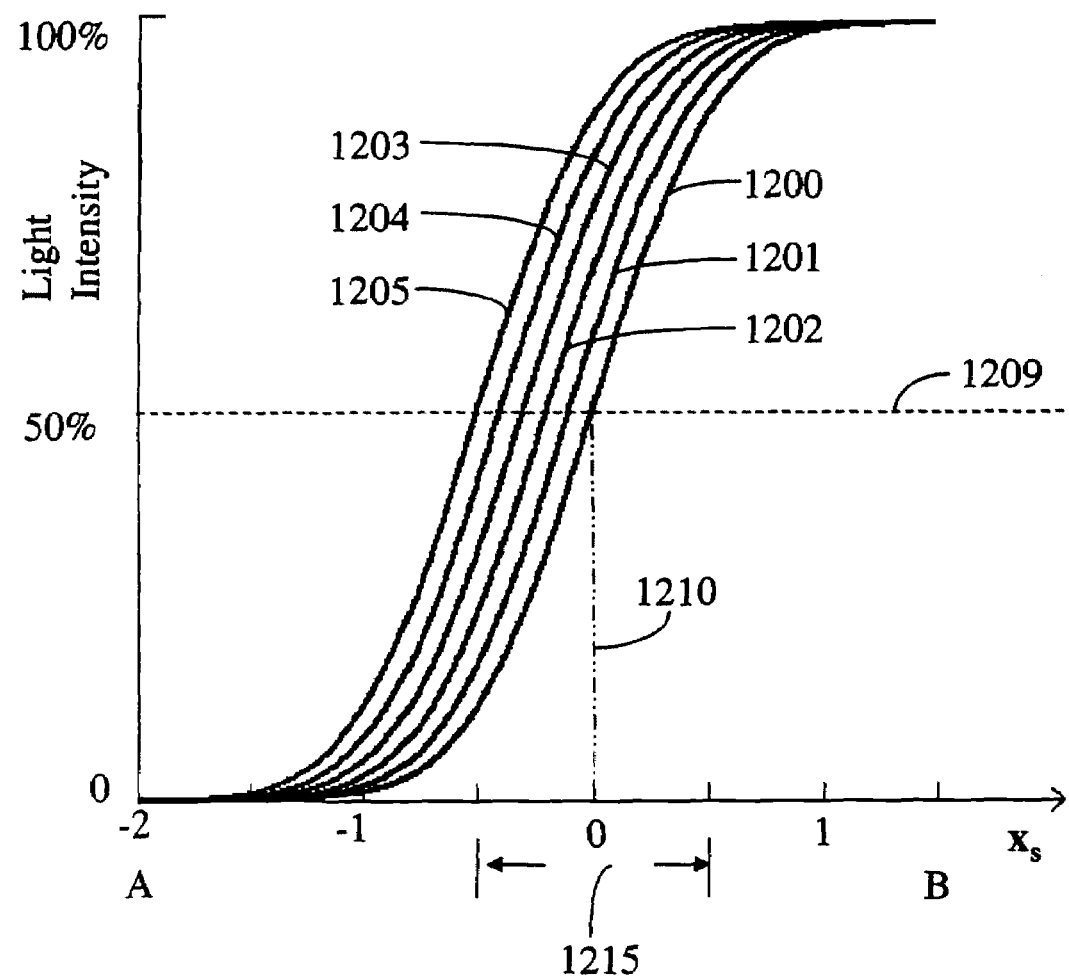
FIG. 12 is a graph showing instantaneous light intensity distributions along the line segment AB on the substrate of FIG. 10, at equally spaced time intervals T/10, starting at T3.

The consequences of the movement of the projected pattern across the substrate surface during exposure will now be examined. FIG. 12 shows instantaneous light intensity distributions on substrate array 1002 from FIG. 10; the distributions are along the position of line segment AB as shown in FIG. 11. Note that in FIG. 12 the line segment AB is shown to extend from −2 to 1.5 on the abscissa. In FIG. 12, six distributions are shown at intervals of T/10 starting at T3 and then every T/10, where T is defined in equation (1) above. The substrate is moving with constant velocity. The abscissa represents substrate displacement $x_s$ (as shown in FIGS. 8 and 9) measured in units of projected row pitch (as defined above in reference to FIG. 10). The following are shown in FIG. 12: light intensity profiles 1200, 1201, 1202, 1203, 1204 and 1205; 50% light intensity marker 1209; 50% position marker 1210; and projected row pitch 1215. The shape of light intensity profiles 1200, 1201, 1202, 1203, 1204 and 1205 is shown as being Gaussian; however, the actual shape depends on details of the optics. The instantaneous light intensity as a function of position on the substrate array 1002 at time T3 is represented by light intensity profile 1200. Light intensity profile 1200 is positioned such that the intersection of the 50% marker 1209 on the abscissa corresponds to the boundary between rows R3 and R4 on the substrate array. The region between −1 and 0 on the abscissa corresponds to R4 on the substrate array, the region between 0 and 1 corresponds to R3 and the region between 1 and 2 corresponds to R2. As the stage moves substrate array 1002 in the +x direction, the instantaneous light intensity profile advances across the substrate array in the $-x_s$ direction. The light intensity profiles 1201, 1202, 1203, 1204 and 1205 are for times T3 plus T/10, 2T/10, 3T/10, 4T/10 and 5T/10, respectively. The light intensity profile advances across the substrate in the $-x_s$ direction by one-half of the projected row pitch during T/2. In this example, at T3 plus T/2 the elements in SLM array 1000 switch from the pattern shown at T3 to the pattern shown at T4. Looking specifically at the array elements responsible for generating the light intensity profiles: the element at C4R4 switches from "on" to "off", the elements at C4R3 and C4R2 remain "on" and the element at C4R1 switches from "off" to "on". The effect is to shift the light intensity profile from the position of 1205 to a new position which is one times the projected row pitch in the $+x_s$ direction.

Figure 13:
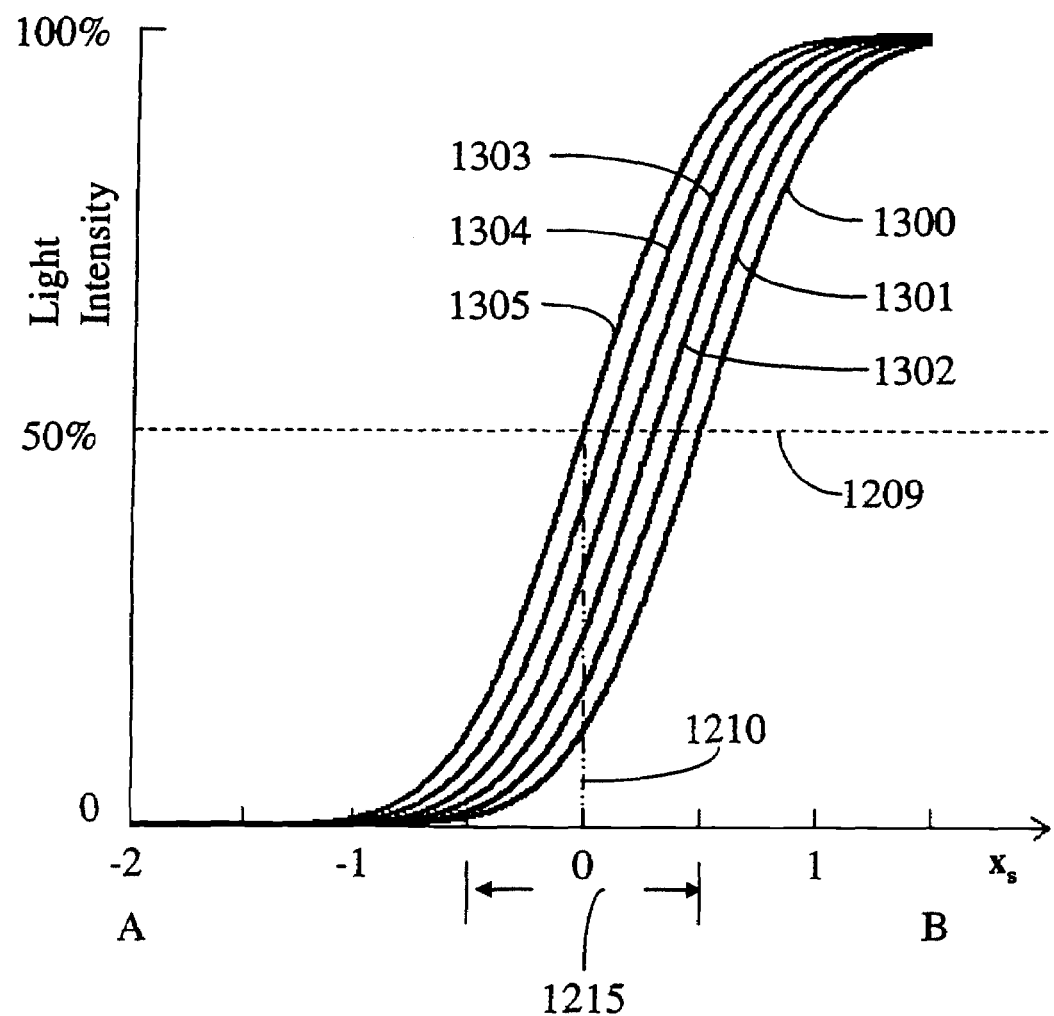
FIG. 13 is a graph showing instantaneous light intensity distributions along the line segment AB on the substrate of FIG. 10, at equally spaced time intervals T/10, ending at T4.

FIG. 13 follows on from FIG. 12 showing the light intensity profiles for the next period T/2. After the elements switch at time T3+T/2 the light intensity profile moves from the position of 1205 (see FIG. 12) to that of 1300 (see FIG. 13). As the stage continues to move the substrate array 1002 in the +x direction, the instantaneous light intensity profile advances across the substrate array in the $-x_s$ direction. The light intensity profiles 1301, 1302, 1303, 1304 and 1305 are for times T3 plus 6T/10, 7T/10, 8T/10, 9T/10 and 10T/10, respectively. Light intensity profile 1305 is at time T3+T, which is the same as time T4. The light intensity profile advances across the substrate in the $-x_s$ direction by one-half of the projected row pitch during T/2. Consequently, the position of light intensity profile 1305 at T4 is the same as for profile 1200 at T3.

Figure 14:
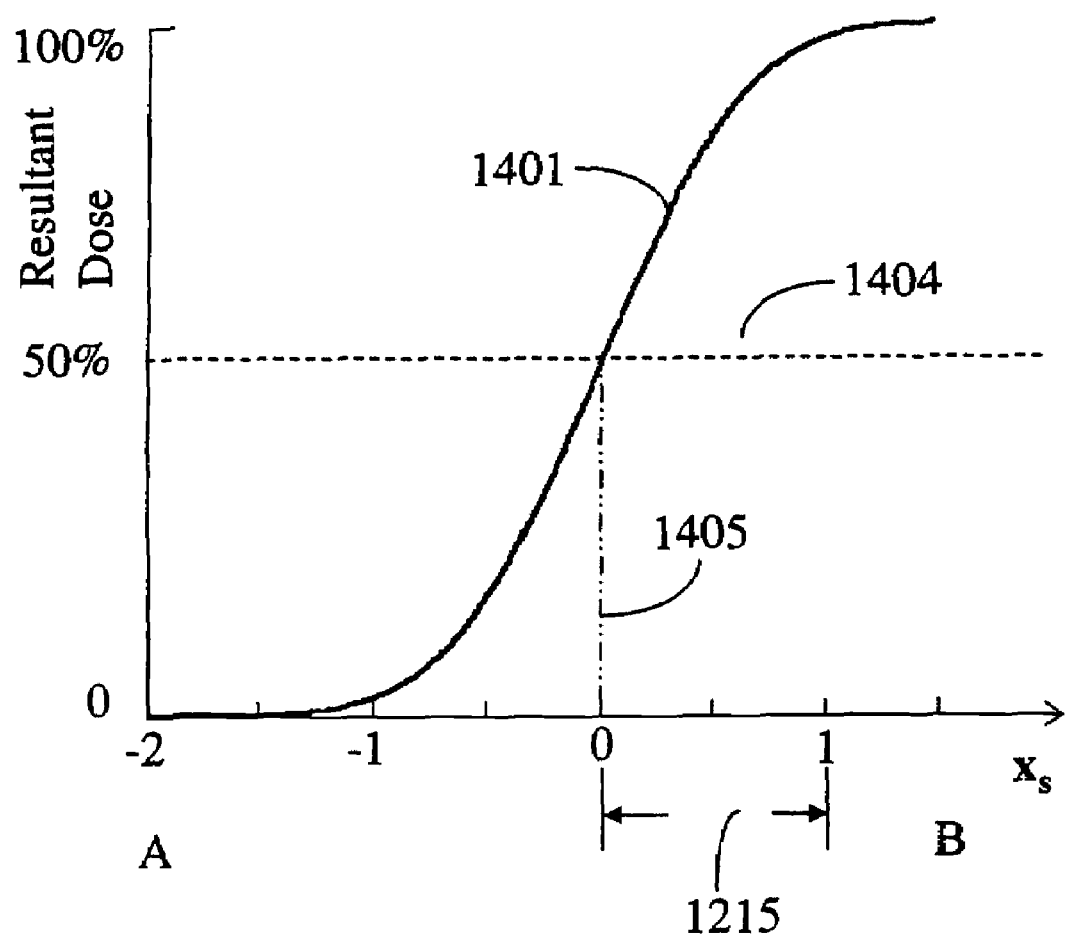
FIG. 14 is a graph showing the integrated dose distribution along the line segment AB on the substrate of FIG. 10, due to light exposure between times T3 and T4.

FIGS. 12 and 13 have shown how the light intensity distribution varies over the time interval between T3 and T4. FIG. 14 shows the resultant dose distribution for the same position on substrate array 1002—along line segment AB. The light intensity distributions 1200 and 1300 in FIGS. 12 and 13 are Gaussian with σ=0.43. One can see from FIG. 14 that the resultant dose profile 1401 has a similar form to the original Gaussian.

The following are shown in FIG. 14: resultant dose profile 1401, 50% resultant dose marker 1404, 50% position marker 1405 and projected row pitch 1215. Because the elements in SLM array 1000 in FIG. 10 are switched when the substrate array 1002 has moved by one-half of the projected row pitch 1008, the 50% resultant dose marker 1404 intersects the resultant dose profile 1401 at position 1405, which is the same as position 1210 in FIGS. 12 and 13. This is due to the symmetrical nature of the process shown in FIGS. 12 and 13. Other choices of element switching time, besides Tn+T/2 (where n=1, 2, 3 . . . ), could be used (such as Tn+T/5). The shape of the resultant dose profile would be the same as 1401, but the 50% resultant dose location on the abscissa would be shifted from 0. Clearly, modulating the switching time can be used to control the position of printed pattern edges. However, it is preferred to keep the switching time constant. The shape of the dose distribution will not usually be the same as the instantaneous light intensity profiles. This means that the dose profile for edges parallel to the direction of stage motion will differ from those that are orthogonal. Edges parallel to the direction of stage motion are not constantly moving, consequently the dose profile on the substrate for such an edge will be identical to its instantaneous light intensity profile.

Figure 15:
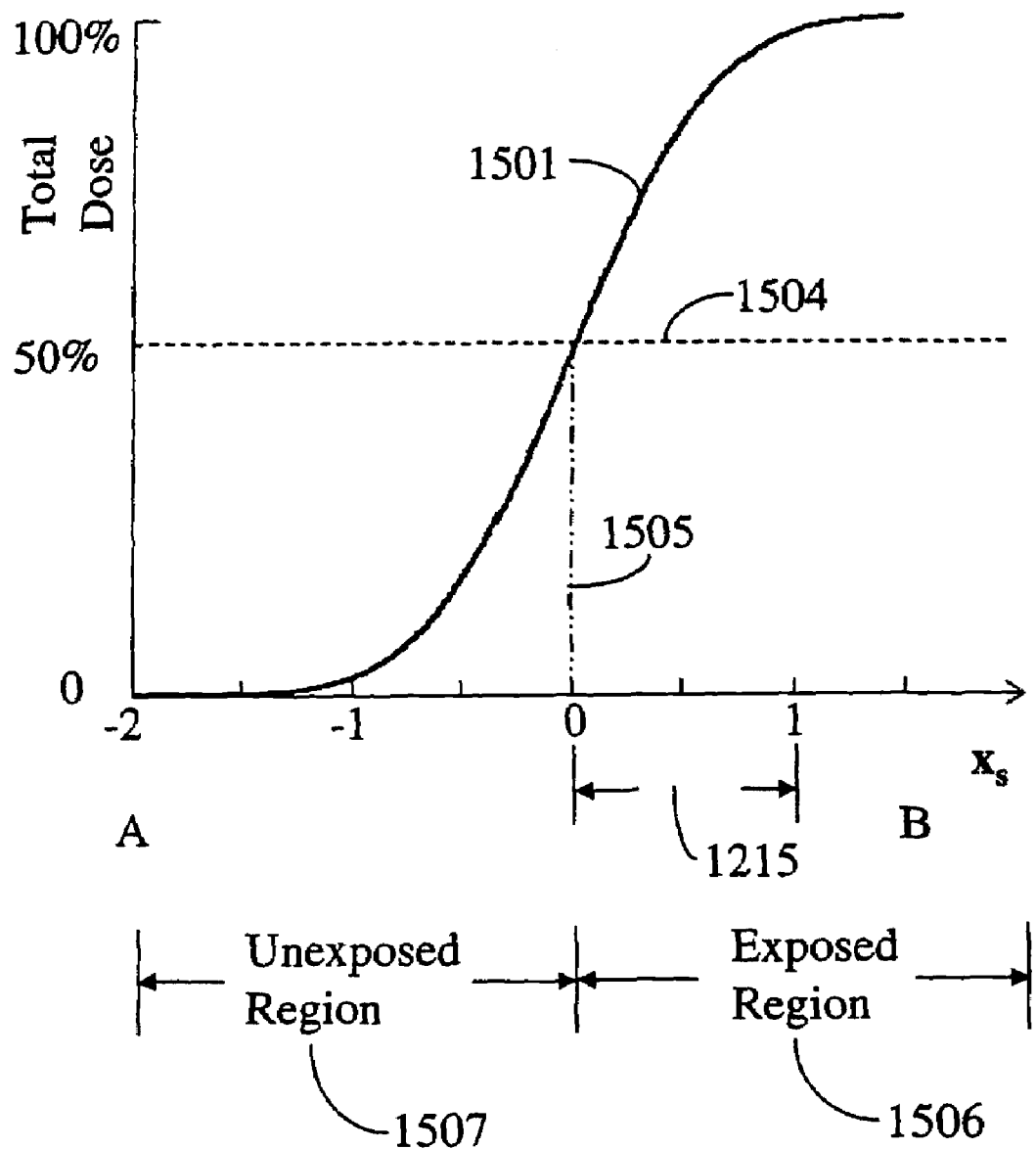
FIG. 15 is a graph showing the total dose distribution along the line segment AB on the substrate of FIG. 10, due to light exposure between times T1 and T7.

Referring back to FIG. 10, the process of switching the elements in SLM array 1000 at times Tn+T/2 (where n=1, 2, 3, . . . ) is repeated until the pattern has completely scrolled off the SLM array 1000, which in this example is at time T7. Since the time interval between any two consecutive "snapshot" times is equal to T from equation (1), the switching times are equal to (T1+T2)/2, (T2+T3)/2, (T3+T4)/2, (T4+T5)/2, (T5+T6)/2 and (T6+T7)/2 respectively. Because the dose is additive, the final dose profile along line segment AB will have the same shape as resultant dose profile 1401 in FIG. 14. FIG. 15 shows the total dose profile 1501. The following are shown in FIG. 15: total dose profile 1501, 50% total dose marker 1504, 50% position marker 1505, exposed region 1506, unexposed region 1507 and projected row pitch 1215. It is preferred to adjust the total dose so that, after development, the edge of the printed feature is at the 50% position marker

1505. In which case, the region with more than 50% total dose is the exposed region 1506, while the region with less than 50% total dose is the unexposed region 1507. Under these conditions, the final developed pattern would be similar to the resultant image 1007 in FIG. 10—light areas correspond to exposed regions 1506 and dark areas correspond to unexposed regions 1507. Except for some corner rounding, all the pattern edges line up with the reference grid. Slight changes in exposure dose will affect vertical and horizontal dimensions differently. This is a practical problem only if the slope of the light intensity profile at and around 50% light intensity is not steep enough (a steep slope allows sufficient line width control, assuming reasonable exposure and processing variations).

Consider a lithography tool as in FIGS. 1 and 10 described above. The dose distribution along the x direction on the surface of the substrate is given by the following equation:

$$D(x) = N \int_0^T I_w(x, t) dt \quad (2)$$

where N is a constant, $I_w/(x,t)$ is the time dependent light intensity distribution at the surface of the substrate, and time T satisfies equation (1). If the substrate is moving at constant speed v, then the light intensity for the moving substrate, $I_w$, is related to the light intensity for the substrate at rest, $I_w$, by:

$$I_w(x,t) = I(x+vt, t) \quad (3)$$

Between t=0 and t=T/2 the elements in the SLM are in one state and shift at t=T/2 by one row, i.e.;

$$I(x,t) = I_0(x) \quad 0 < t < T/2$$

$$I(x,t) = I_0(x-pM) \quad T/2 < t < T \quad (4)$$

Where $I_0(x)$ is the intensity distribution for a single SLM element with the substrate at rest, p is the row pitch of the SLM array elements and M is the projection lens system magnification. Using equations (1), (3) and (4), equation (2) can be written as:

$$D(x) = N \left[ \int_0^{T/2} I_0(x+vt) dt + \int_{T/2}^T I_0(x+vt+vT) dt \right] \quad (5)$$

As an example, assume the distribution $I_0(x)$ is Gaussian in form. Then for 10 rows of elements in the "on" state the intensity distribution at the substrate would be:

$$I_0(x) = \frac{1}{2.51\sigma} \int_0^{10} e^{-(x-y)^2/2\sigma^2} dy \quad (6)$$

where $\sigma^2$ is the variance.

Equations (5) and (6) are examples of the form of equations used to calculate the dose distributions and intensity distributions shown in the Figures.

In order to make fine adjustments to the location of feature edges, a "gray level" technique can be used. When such a technique is implemented on apparatus such as that shown in FIGS. 1 through 6, it is required that the image of an individual element of the SLM produced by the projection lens system must be "blurred" i.e. the element is not clearly resolved. This "blurring" can be accomplished in various ways including defocusing, using a microlens array or a diffuser or, more commonly, by adjusting the numerical aperture of one of the lenses in the projection lens system to decrease the resolution to the desired value. The preferred method is defocusing. The technique can be understood by referring to FIG. 16.

Figure 16:
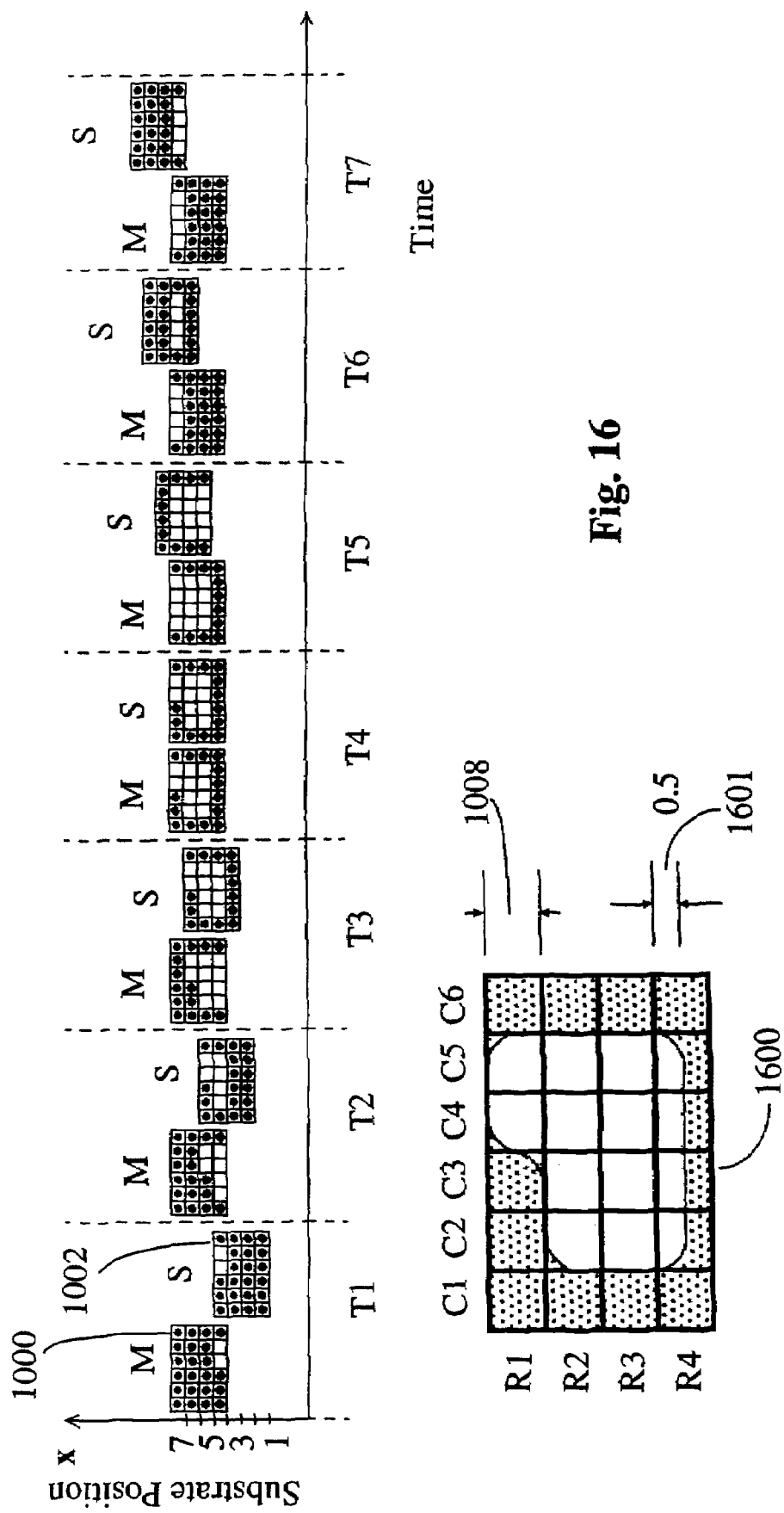
FIG. 16 is a diagrammatic representation of the process of forming a latent image including a first example of edge shifting by one half of the projected width of a mirror, in accordance with the invention.

FIGS. 16 through 19 illustrate examples of "gray level" edge shifting on a pattern edge that is orthogonal to the direction of substrate motion during exposure; in these examples the substrate is assumed to be moving in the same direction at constant speed during exposure. FIGS. 16 through 19 are very similar to FIG. 10. The significant difference is the displacement of the "trailing edge" of the resultant image by a fraction of a pixel; for example, examination of the "trailing edge" of the resultant image 1600 in FIG. 16 shows a displacement 1601 which is 0.5 times the row pitch 1008. Note that for ease of illustration the patterns shown on the substrate arrays 1002 do not show any blurring or optical interference effects.

In FIG. 16 the sequence of patterns on SLM arrays 1000 are identical to the patterns shown in FIG. 10 at times T1, T2, T3, T4 and T6. However, at time T5 the elements in SLM array 1000 at locations R3C2, R3C3, R3C4 and R3C5 are in the "on" state in FIG. 16 and in the "off" state in FIG. 10. Also, at time T7 elements in SLM array 1000 at locations R1C2, R1C3, R1C4 and R1C5 are in the "on" state in FIG. 16 and in the "off" state in FIG. 10. With reference to substrate section 1002 in FIG. 16, pixels R4C2, R4C3, R4C4 and R4C5 are exposed at times T5 and T7, but not at times T1, T2, T3, T4 or T6. All other rows of the pattern are exposed for four time periods—for example, pixels R1C4 and R1C5 were exposed at times T1, T2, T3 and T4, while pixels R2C2, R2C3, R2C4 and R2C5 were exposed at times T2, T3, T4 and T5. The effect of the two time period only exposure in row R4 is to produce an edge displacement 1601 of roughly 0.5 times the width of the projected row pitch 1008, as can be seen in the resultant image 1600.

Figure 17:
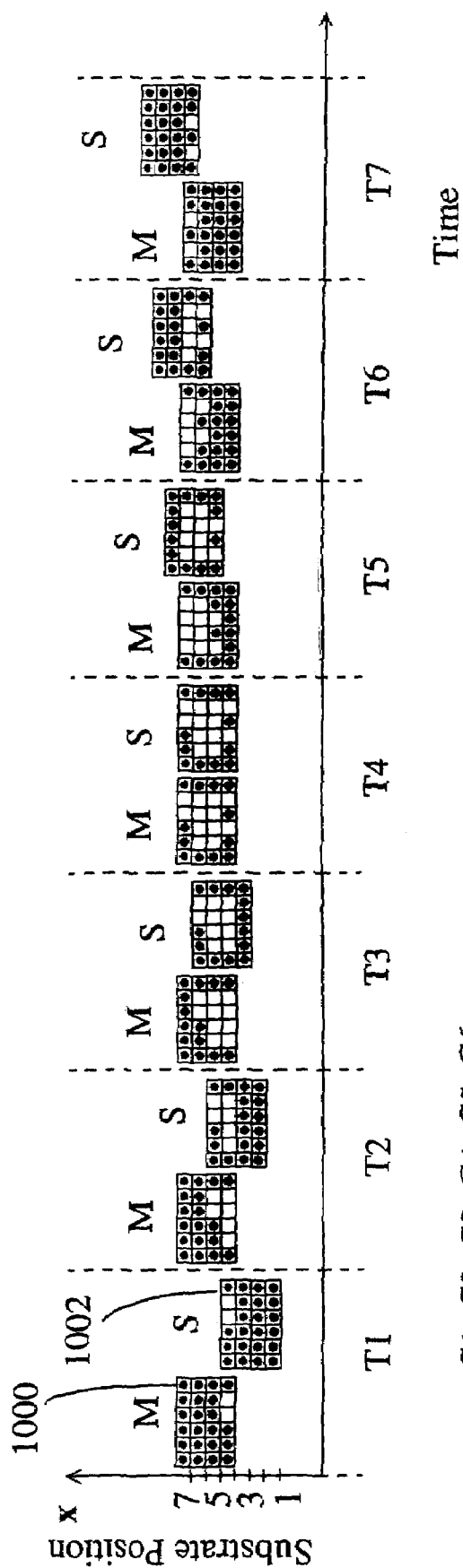
FIG. 17 is a diagrammatic representation of the process of forming a latent image including a second example of edge shifting by one half of the projected width of a mirror, in accordance with the invention.
Figure 17:
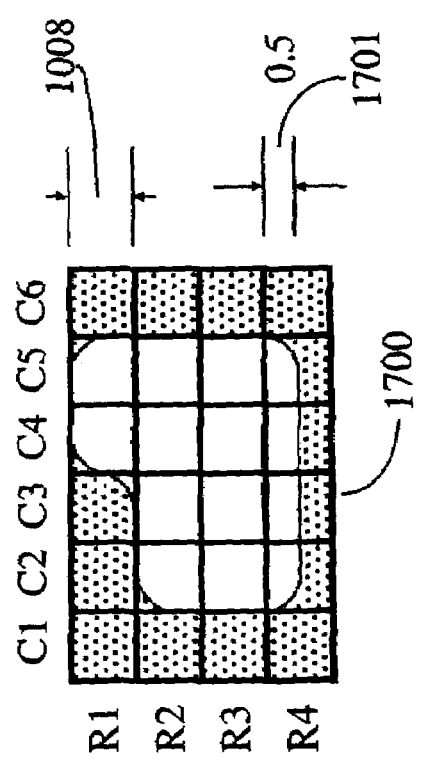

The sequence of exposures in FIG. 17 produces an edge displacement 1701 of roughly 0.5 times the width of the projected row pitch 1008, as can be seen in the resultant image 1700. This resultant image 1700 is identical to the resultant image 1600 in FIG. 16; however, the two resultant images are produced with different sets of exposure patterns. The exposure patterns in the 2 figures are different at times T4, T5, T6 and T7. These 2 examples are certainly not exhaustive. One can easily imagine other sequences of exposure patterns that give the same resultant image.

Figure 18:
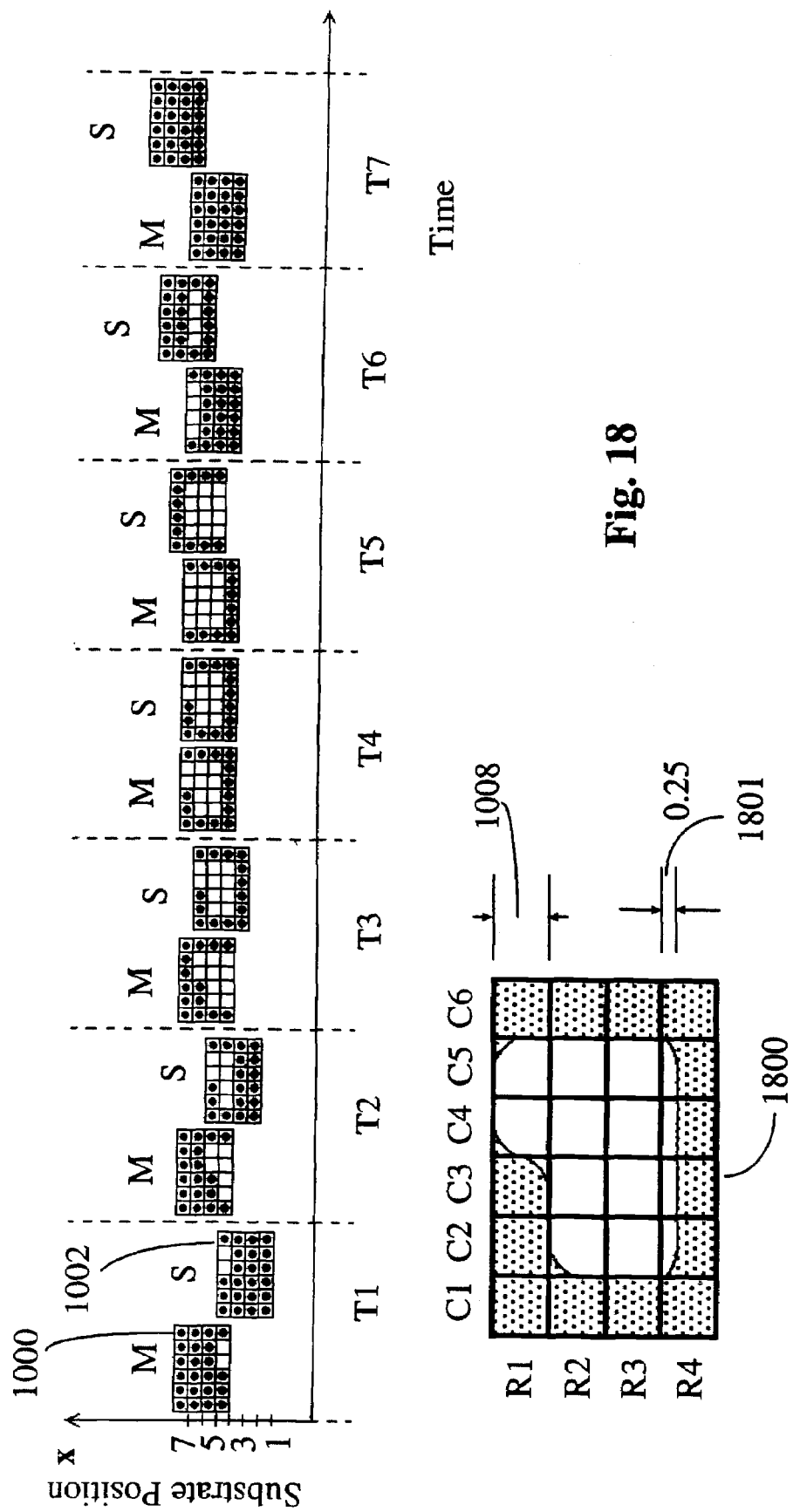
FIG. 18 is a diagrammatic representation of the process of forming a latent image including an example of edge shifting by one quarter of the projected width of a mirror, in accordance with the invention.

FIG. 18 illustrates a further example of "gray level" edge shifting, in this example the trailing edge displacement 1801 is 0.25 times the row pitch 1008. The sequence of patterns on SLM array 1000 shown in FIGS. 10 and 18 at times T1, T2, T3, T4, T6 and T7 are identical. However, at time T5 elements in SLM array 1000 at locations R3C2, R3C3, R3C4 and R3C5 are in the "on" state in FIG. 18 and in the "off" state in FIG. 10. With reference to substrate section 1002 in FIG. 18, pixels R4C2, R4C3, R4C4 and R4C5 are exposed at time T5, but not at times T1, T2, T3, T4, T6 or T7. All other rows of the pattern are exposed for four time periods. The effect of the one time period exposure in row R4 at time T5 is to produce an edge displacement 1801 of roughly 0.25 times the width of the projected row pitch 1008, as can be seen in resultant image 1800.

Figure 19:
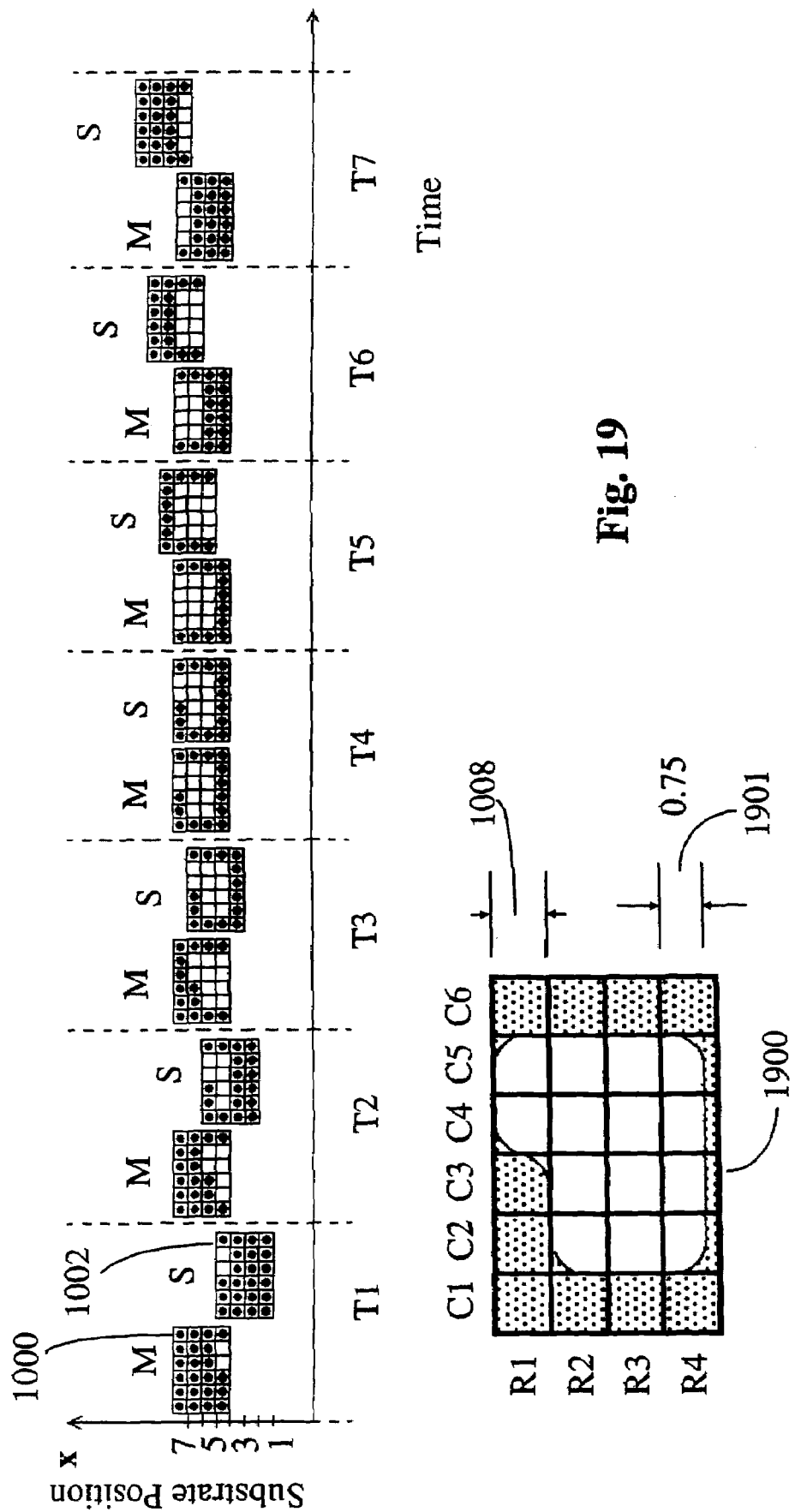
FIG. 19 is a diagrammatic representation of the process of forming a latent image including an example of edge shifting by three quarters of the projected width of a mirror, in accordance with the invention.

FIG. 19 illustrates a further example of "gray level" edge shifting, in this example the trailing edge displacement 1901 is 0.75 times the row pitch 1008. The sequence of patterns on SLM array 1000 shown in FIGS. 19 and 10 at times T1, T2, T3 and T4 are identical. However, at time T5 elements in SLM array 1000 at locations R3C2, R3C3, R3C4 and R3C5 are in the "on" state in FIG. 19 and in the "off" state in FIG. 10. At time T6 elements in SLM array 1000 at locations R2C2, R2C3, R2C4 and R2C5 are in the "on" state in FIG. 19 and are in the "off" state in FIG. 10. Also, at time T7 elements in SLM array 1000 at locations R1C2, R1C3, R1C4 and R1C5, are in the "on" state in FIG. 19 and are in the "off" state in FIG. 10. With reference to substrate section 1002 in FIG. 19, pixels R4C2, R4C3, R4C4 and R4C5 are exposed at times T5, T6 and T7, but not at T1, T2, T3 or T4. All other rows of the pattern are exposed for four time periods. The effect of the three time period exposure in row R4 at times T5, T6 and T7 is to produce an edge displacement 1901 of roughly 0.75 times the width of the projected row pitch 1008, as can be seen in resultant image 1900.

Figure 20:
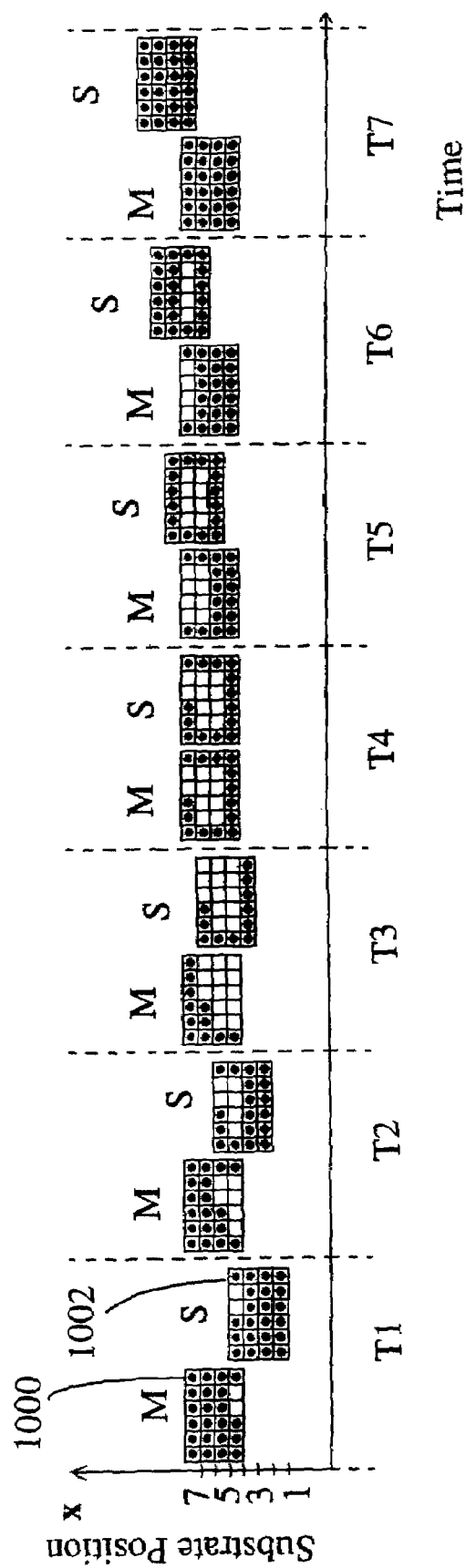
FIG. 20 is a diagrammatic representation of the process of forming a latent image including an example of edge shifting in another direction by one quarter of the projected width of a mirror, in accordance with the invention.
Figure 20:
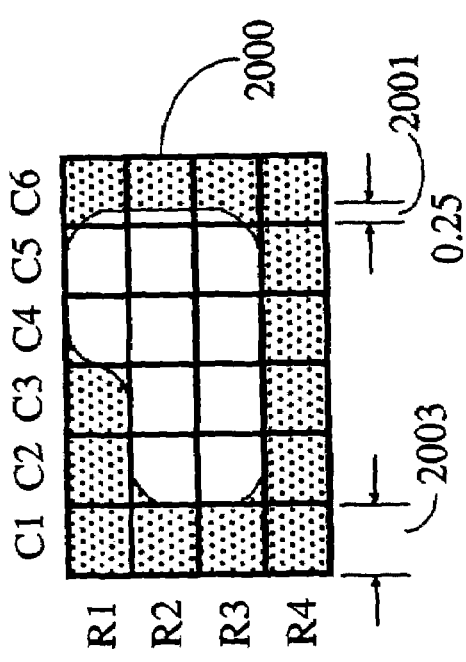

FIG. 20 illustrates an example of "gray level" edge shifting on a pattern edge that is parallel to the direction of substrate motion during exposure; in this example the substrate is assumed to be moving in the same direction at constant speed during exposure. FIG. 20 is very similar to FIG. 10. The significant difference is the displacement of an edge of the resultant image by a fraction of a pixel; for example, examination of the edge of the resultant image 2000 in FIG. 20 shows a displacement 2001 which is 0.25 times the column pitch 2003.

In FIG. 20 the sequence of patterns on SLM array 1000 shown in FIGS. 20 and 10 at times T1, T2, T4, T5, T6 and T7 are identical. However, at time T3 elements in SLM array 1000 at locations R2C6, R3C6 and R4C6 are in the "on" state in FIG. 20 and in the "off" state in FIG. 10. With reference to substrate section 1002 in FIG. 20, pixels R1C6, R2C6 and R3C6 are exposed at time T3 but not at times T1, T2, T4, T5, T6 or T7. All other pixels on the substrate array 1002 are exposed for four time periods. The effect of the one time period exposure in column C6 at time T3 is to produce an edge displacement 2001 of roughly 0.25 times the width of the projected column pitch 2003, as can be seen in resultant image 2000.

Further to edge displacements, using one or more pixel exposures near a corner will affect the degree of corner rounding. For example, with reference to resultant image 1007 in FIG. 10, exposures at R1C1 or at both R1C2 and R2C1 will change the corner rounding at location R2C2.

The edge displacements shown in the resultant images of FIGS. 16 through 20 are only approximate; the actual displacements will depend on the detailed shape of the instantaneous light intensity distribution at the edges of the exposure patterns. A more accurate determination can be made by using a slightly modified form of equation (5) for the dose distribution, including the light intensity distribution appropriate to the mirror section states for each half of the 7 time periods. This modified form of equation (5) was used to calculate resultant dose distributions along the position of line segment AB on substrate array 1002 (see FIG. 11) for the exposure pattern examples given in FIGS. 10, 16, 17, 18 and 19. In these calculations it is assumed that the instantaneous light intensity distribution shape is Gaussian with a σ value of 0.43. These resultant dose distributions are shown in FIG. 21.

Figure 21:
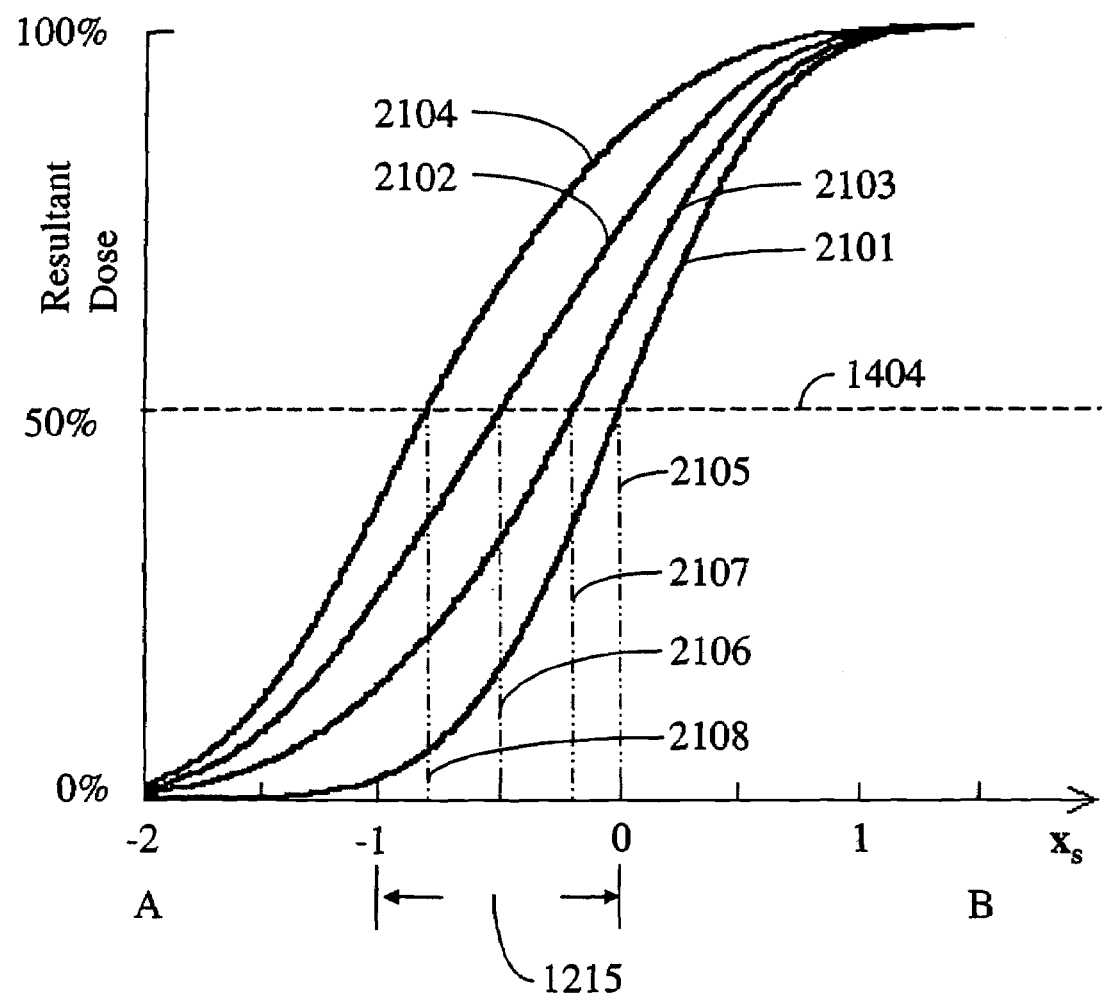
FIG. 21 is a graph showing the integrated dose distributions along the line segment AB on the substrates of FIGS. 10, 16, 17, 18 and 19.

In FIG. 21 resultant dose profiles 2101, 2102, 2103 and 2104 correspond to FIGS. 10, 16, 18 and 19, respectively; resultant dose profile 2102 also corresponds to FIG. 17. 50% position markers 2105, 2106, 2107, 2108 are for dose profiles 2101, 2102, 2103 and 2104, respectively. With reference also to the resultant images in FIGS. 10, 16, 17, 18 and 19, the regions between −1 and 0 and 0 and 1 on the abscissa in FIG. 21 correspond to R4 and R3, respectively, in the resultant images. 50% position marker 2105 of resultant dose profile 2101 was calculated for the example given in FIG. 10 and intersects the abscissa at 0. This result is consistent with the resultant image 1007 shown in FIG. 10. 50% position marker 2106 of resultant dose profile 2102 was calculated for the example given in FIG. 16 and intersects the abscissa at −0.5. This result is in agreement with the value of edge displacement 1601. 50% position marker 2107 of resultant dose profile 2103 was calculated for the example given in FIG. 18 and intersects the abscissa at −0.20. This result is slightly different from the edge displacement 1801 value of 0.25. 50% position marker 2108 of resultant dose profile 2104 was calculated for the example given in FIG. 19 and intersects the abscissa at −0.80. This result is slightly different from the edge displacement 1901 value of 0.75.

It should be noted that the examples given above are simplistic and ignore interference effects from adjacent elements of the SLM, the rigorously correct shape of the light intensity distribution, and the finite contrast of the photosensitive substrate. In general, the correct dose for a particular edge displacement will need to be determined experimentally. However, once the relationship between dose and edge displacement is determined, the technique can be used to compensate for misalignment and distortion of the substrate, distortion and aberrations in the projection lens system, and non-uniform illumination. This technique could be used to relax the specification of the optics, thus reducing the cost of the optics.

The preferred SLM device is the two-state DMD from Texas Instruments which has a rectangular array of mirrors—1024 mirrors wide by 768 mirrors deep. The scan direction during exposure of the substrate is preferably orthogonal to the 1024 width in order to minimize the number of times the stage must reverse direction along its serpentine path (see FIG. 8). Since the array is 768 rows deep, the exposure patterns will scroll across the array in 768 discrete steps and there will be 768 opportunities to adjust edge locations using the "gray level" technique outlined above. This allows for an edge placement resolution of $1/768^{th}$ the size of the projected row pitch of the DMD in the resultant image. In practice, one rarely needs more than $1/32^{nd}$. Consequently, 32 equally spaced edge positions can be chosen and the extra resolution can be used to compensate for non-uniform illumination of the substrate.

The minimum feature size that can be printed on the substrate depends on the characteristics of the light intensity profile. This will be explained with reference to FIGS. 22 through 27.

Figure 22:
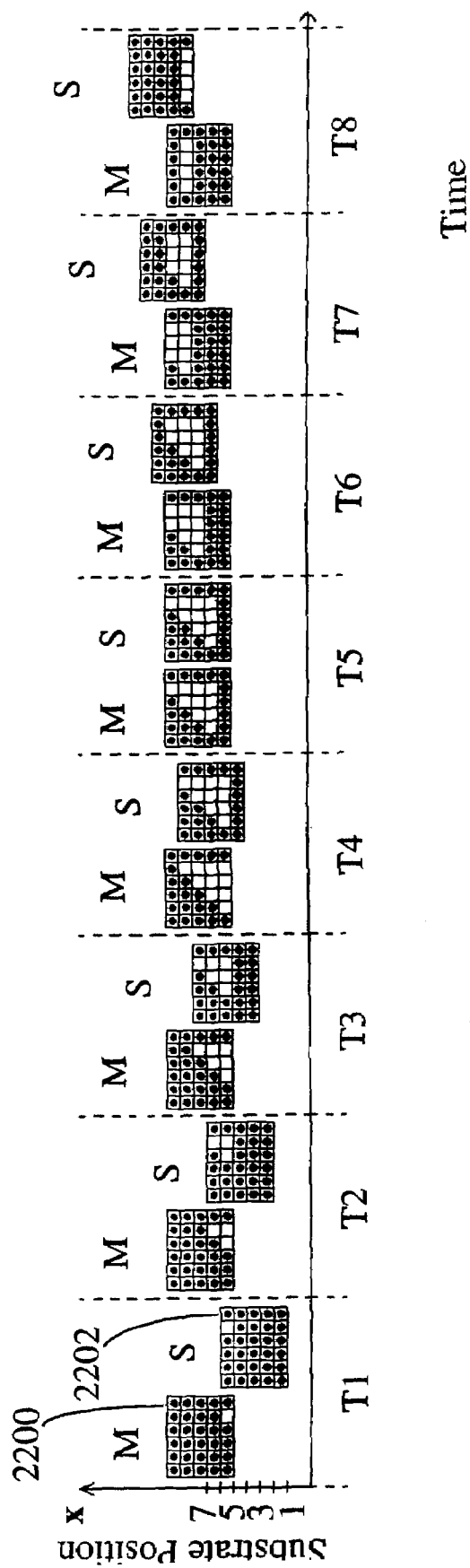
FIG. 22 is a further diagrammatic representation of the process of forming a latent image, in accordance with the invention.
Figure 22:
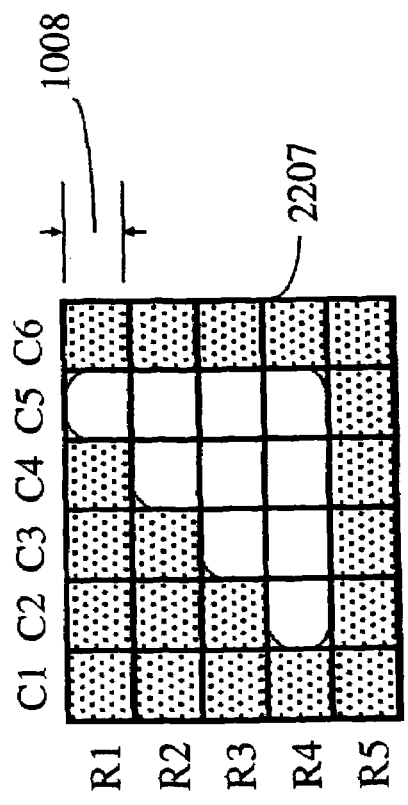

FIG. 22 illustrates another example of the shifting of patterns on the SLM and the corresponding image on the substrate. As in previous examples, the substrate is on a stage and moves at constant speed in the x direction during exposures. The following are shown, with reference also to FIG. 1: part of SLM 120, which is an array of elements 2200 with an area of 5 rows by 6 columns; a corresponding part of substrate 140, which is an array of pixels 2202 with an area of 5 rows by 6 columns; resultant image 2207 with projected row pitch (width of a pixel) 1008. "Snapshots" of the corresponding parts of the SLM and substrate are shown at equally spaced times T1 through T8, where the time interval satisfies equation (1). This figure is similar to FIG. 10.

Figure 23:
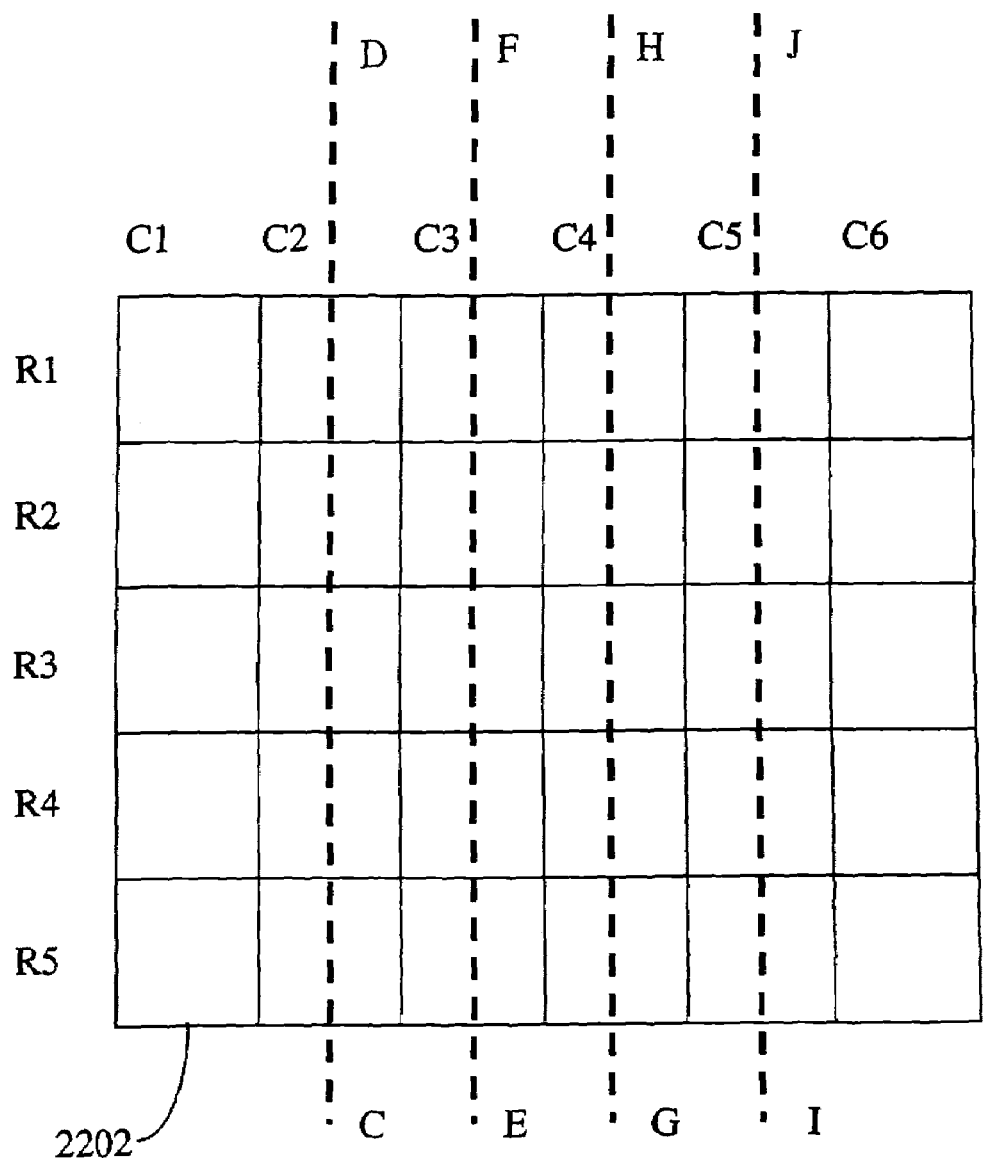
FIG. 23 is a diagrammatic representation of the substrate array of FIG. 22.

FIG. 23 shows the substrate array 2202 with line segments CD, EF, GH and IJ positioned in the center of columns C2, C3, C4 and C5. Light intensity and resultant dose profiles will be determined on the surface of the substrate array in the positions indicated by the line segments. Note that the positions of the line segments are such that they cross both the "trailing edge" and "leading edge" of the exposure pattern shown in FIG. 22.

Figure 24:
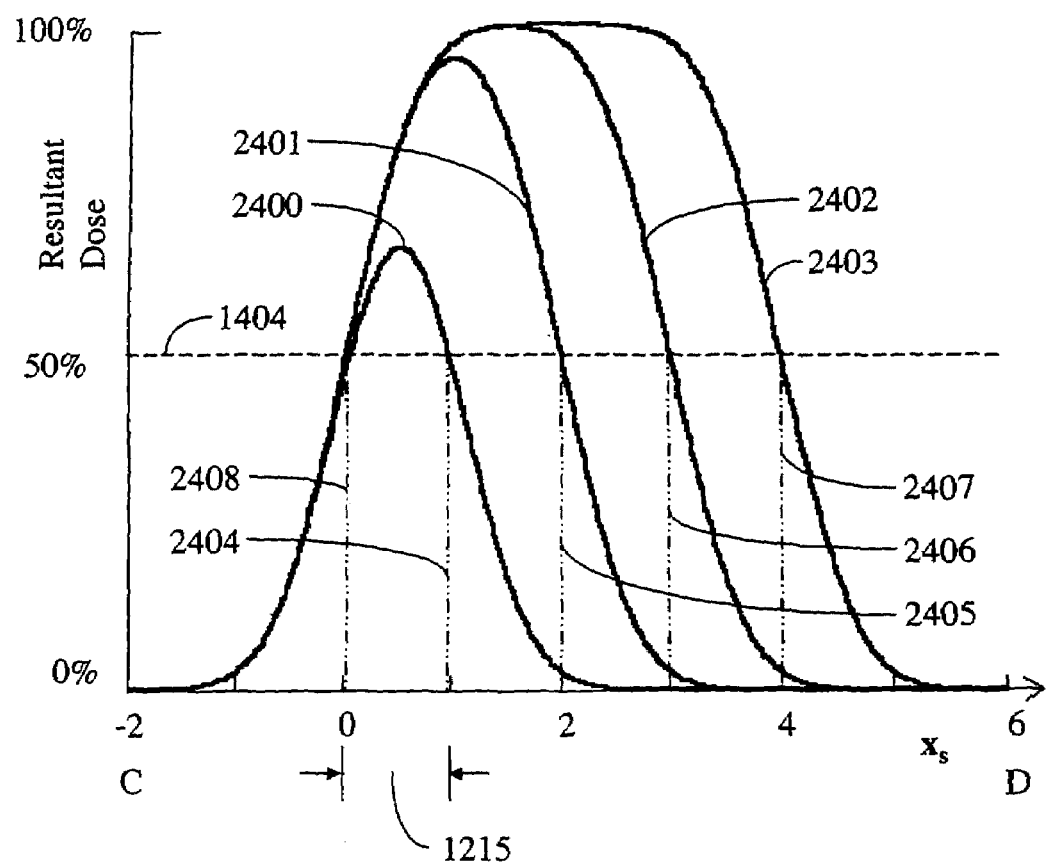
FIG. 24 is a graph showing the integrated dose distributions along the line segments CD, EF, GH and IJ on the substrate of FIG. 22.

FIG. 24 shows resultant dose distributions for the exposed substrate 2202, as detailed in FIG. 22. A Gaussian shape with a σ value of 0.43 is assumed for the instantaneous light intensity distributions used to derive the resultant dose distributions. The following are shown in FIG. 24: resultant dose profiles 2400, 2401, 2402 and 2403 along line segments CD, EF, GH and IJ, respectively; 50% position markers 2405, 2406 and 2407 corresponding to dose profiles 2401, 2402 and 2403, respectively; 50% position markers 2404 and 2408, both corresponding to dose profile 2400; and projected row pitch 1215. Note that the line segment CD is shown to extend from −2 to 6 on the abscissa; line segments EF, GH and IJ extend over the same values on the abscissa, but are not shown so as to avoid cluttering the figure. The regions between −1 and 0, 0 and 1, 1 and 2, 2 and 3, and 3 and 4 on the abscissa in FIG. 24 correspond to R5, R4, R3, R2, and R1, respectively, on the resultant image 2207 in FIG. 22. If the total dose is adjusted such that the edge of printed features is at the 50% position markers, which is preferred, than the final developed pattern would be similar to the resultant image 2207 in FIG. 22. It should be noted that resultant dose profile 2400 in FIG. 24 never rises higher than about 70% of dose profiles 2402 and 2403, and that the distance between the 50% position markers 2404 and 2408 is slightly less than the projected row pitch 1008. Clearly, under these conditions the minimum feature size is roughly the same as the projected row pitch 1008. The "gray level" technique described earlier can be used to adjust the width of such a feature—for example, decreasing the total dose for pixel R4C2 in substrate array 2202 of FIG. 22 will reduce the height of resultant dose profile 2400, which decreases the size of the printed feature. However, the feature dimension changes rapidly with small changes in dose near the top of dose profile 2400. Furthermore, there is always some noise and uncertainty in the total dose which places a practical limit on this approach.

Figure 25:
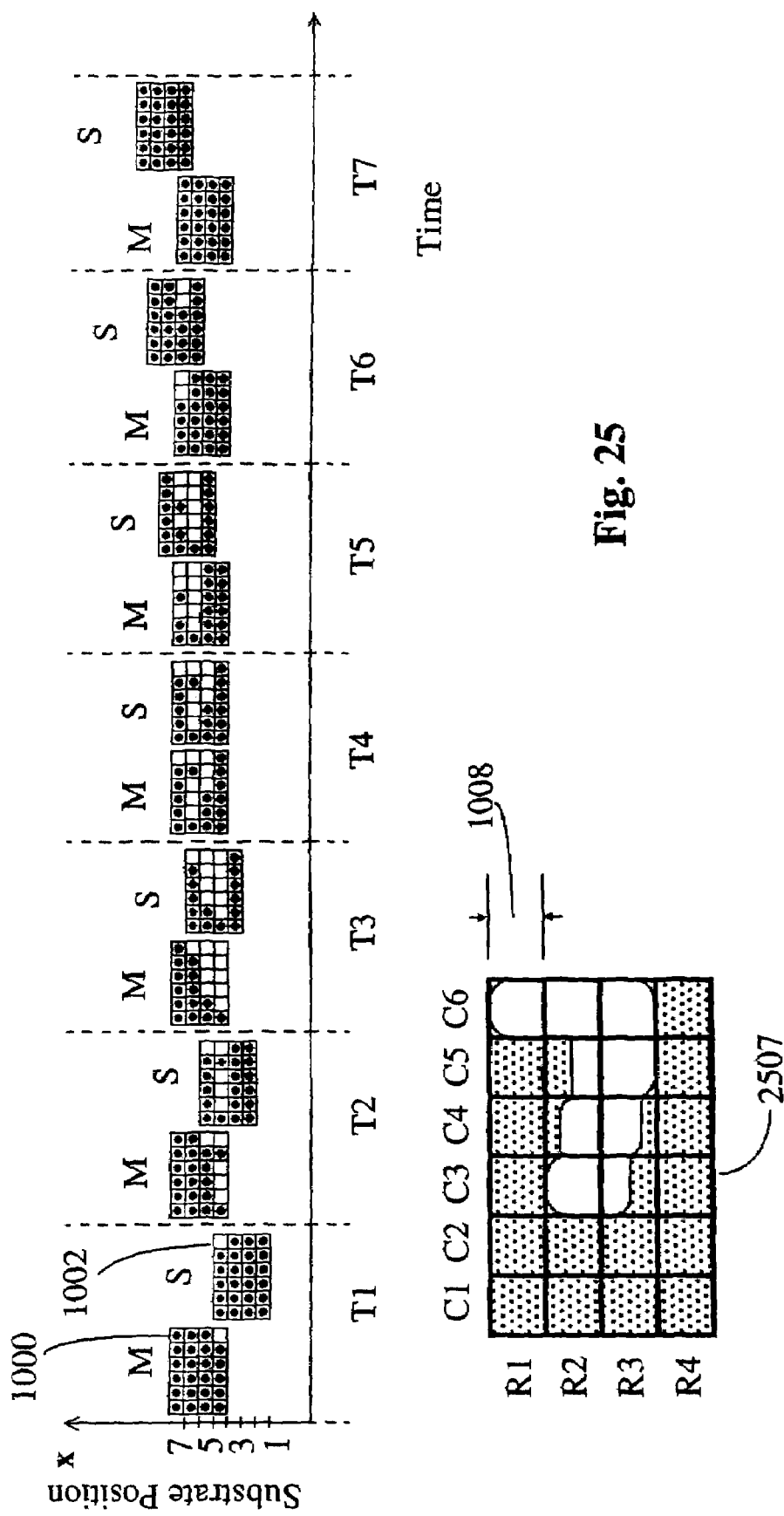
FIG. 25 is a diagrammatic representation of the process of forming a latent image including a further example of edge shifting, in accordance with the invention.

FIG. 25 illustrates a further example of the shifting of patterns on the SLM and the corresponding image on the substrate. As in previous examples, the substrate is on a stage and moves at constant speed in the x direction during exposures. In FIG. 25 examples of "gray level" edge shifting on various sizes of feature are shown, where the shifted edges are orthogonal to the direction of substrate motion during exposure. The following are shown, with reference also to FIG. 1: part of SLM 120, which is an array of elements 1000 with an area of 4 rows by 6 columns; a corresponding part of substrate 140, which is an array of pixels 1002 with an area of 4 rows by 6 columns; resultant image 2507 with projected row pitch (width of a pixel) 1008. "Snapshots" of the corresponding parts of the SLM and substrate are shown at equally spaced times T1 through T7, where the time interval satisfies equation (1). This figure is similar to FIG. 10.

Figure 26:
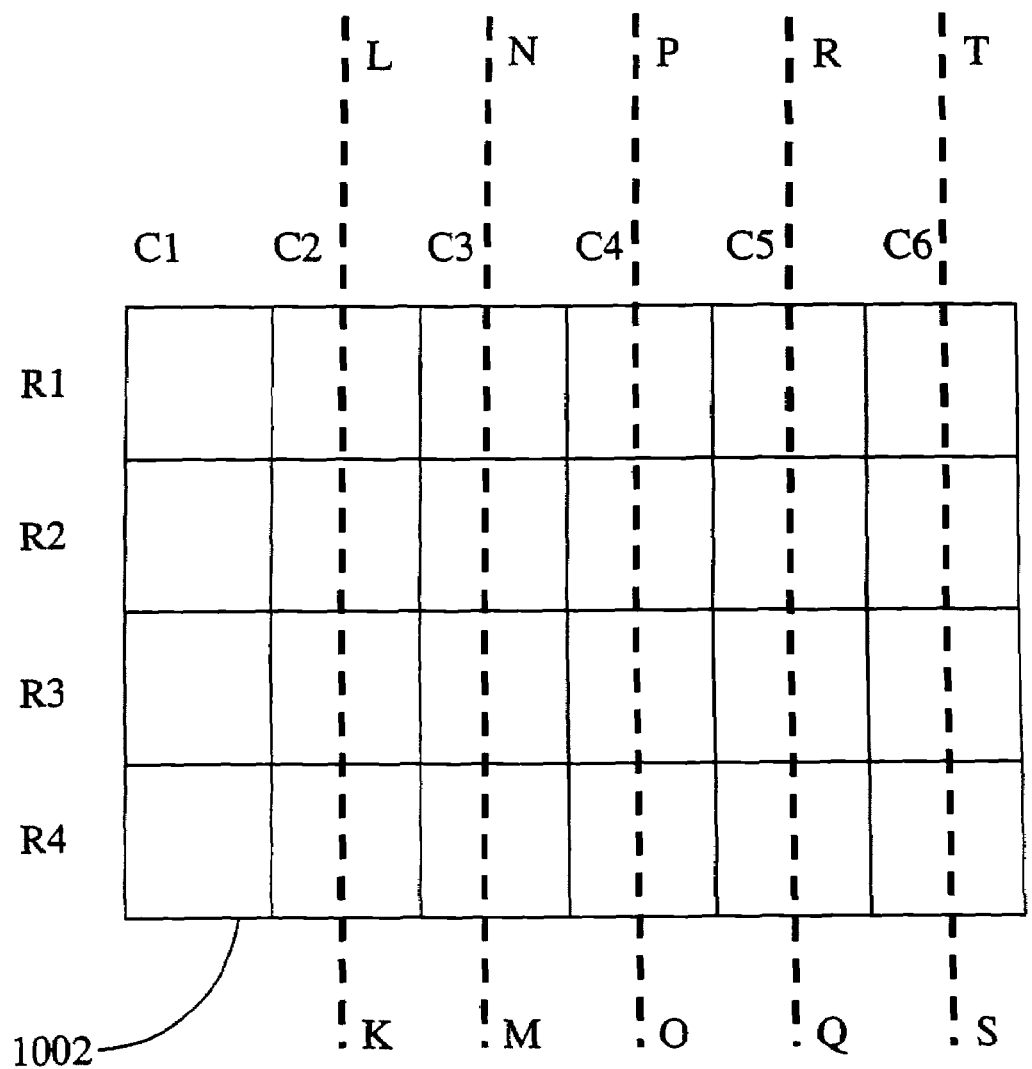
FIG. 26 is a diagrammatic representation of the substrate array of FIG. 25.

FIG. 26 shows the substrate array 1002 with line segments KL, MN, OP, OR and ST positioned in the center of columns C2, C3, C4, C5 and C6. Light intensity and resultant dose profiles will be determined on the surface of the substrate array in the positions indicated by the line segments. Note that the positions of the line segments are such that they cross the "trailing edge" and "leading edge" of the exposure pattern shown in FIG. 25.

Figure 27:
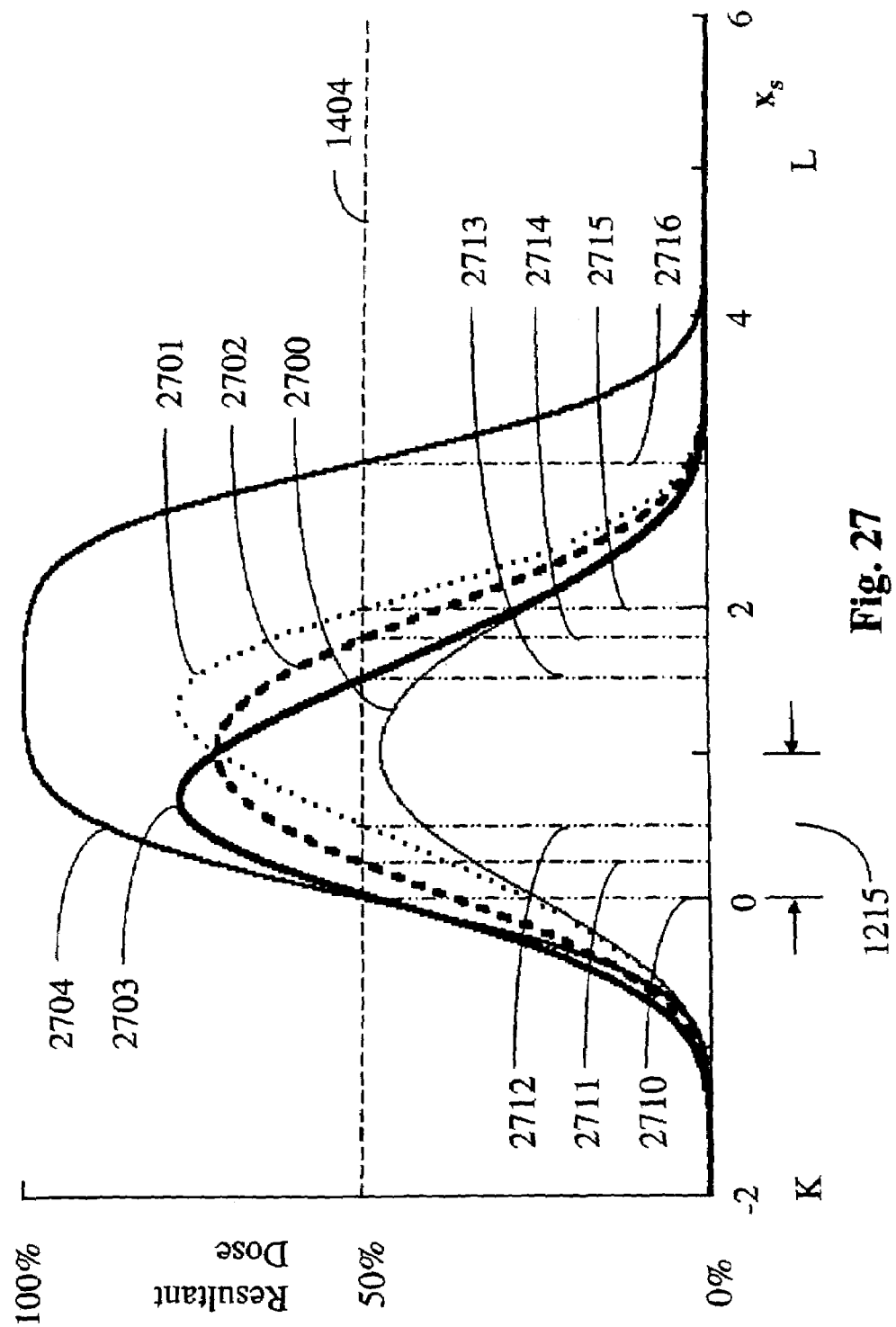
FIG. 27 is a graph showing the integrated dose distributions along the line segments KL, MN, OP, QR and ST on the substrate of FIG. 25.

FIG. 27 shows resultant dose distributions for the exposed substrate 1002, as detailed in FIG. 25. A Gaussian shape with a σ value of 0.43 is assumed for the instantaneous light intensity distributions used to derive the resultant dose distributions. The following are shown in FIG. 27: resultant dose profiles 2700, 2701, 2702, 2703 and 2704 along line segments KL, MN, OP, OR and ST, respectively; 50% position markers 2710 and 2716 both corresponding to dose profile 2704; 50% position markers 2710 and 2713 both corresponding to dose profile 2703; 50% position markers 2711 and 2714 both corresponding to dose profile 2702; 50% position markers 2712 and 2715 both corresponding to dose profile 2701; and projected row pitch 1215. Note that the line segment KL is shown to extend from −2 to 5 on the abscissa; line segments MN, OP, OR and ST extend over the same values on the abscissa, but are not shown so as to avoid cluttering the figure. The regions between −1 and 0, 0 and 1, 1 and 2, and 2 and 3 on the abscissa in FIG. 27 correspond to R4, R3, R2, and R1, respectively, on the resultant image 2507 in FIG. 25. If the total dose is adjusted such that the edge of printed features is at the 50% position markers, which is preferred, than the final developed pattern would be similar to the resultant image 2507 in FIG. 25. It should be noted that resultant dose profile 2700 in FIG. 27 never rises higher than about 45% of dose profile 2704, and therefore does not print. Resultant dose profile 2700 is due to exposure by alternating single adjacent pixels, as can be seen by investigating column C2 of substrate section 1002 at times T2, T3, T4 and T5 in FIG. 25. This is in contrast to the example of FIG. 22 where a single pixel exposure created a dose profile that did print. With reference to FIGS. 25 and 27, the features printed in columns C3, C4 and C5 are all roughly 1.5 times the projected row pitch 1008 in width as can be seen, for example, by examining the distance between 50% position markers 2711 and 2714 of resultant dose profile 2702. It appears that when a feature is at some arbitrary location with respect to the projected SLM element grid then the minimum (practical) feature size is roughly 1.5 times the projected row pitch; this is in contrast to the minimum feature size of roughly 1.0 times the projected row pitch seen for features located on the projected SLM element grid—see FIGS. 22 and 24.

Figure 28:
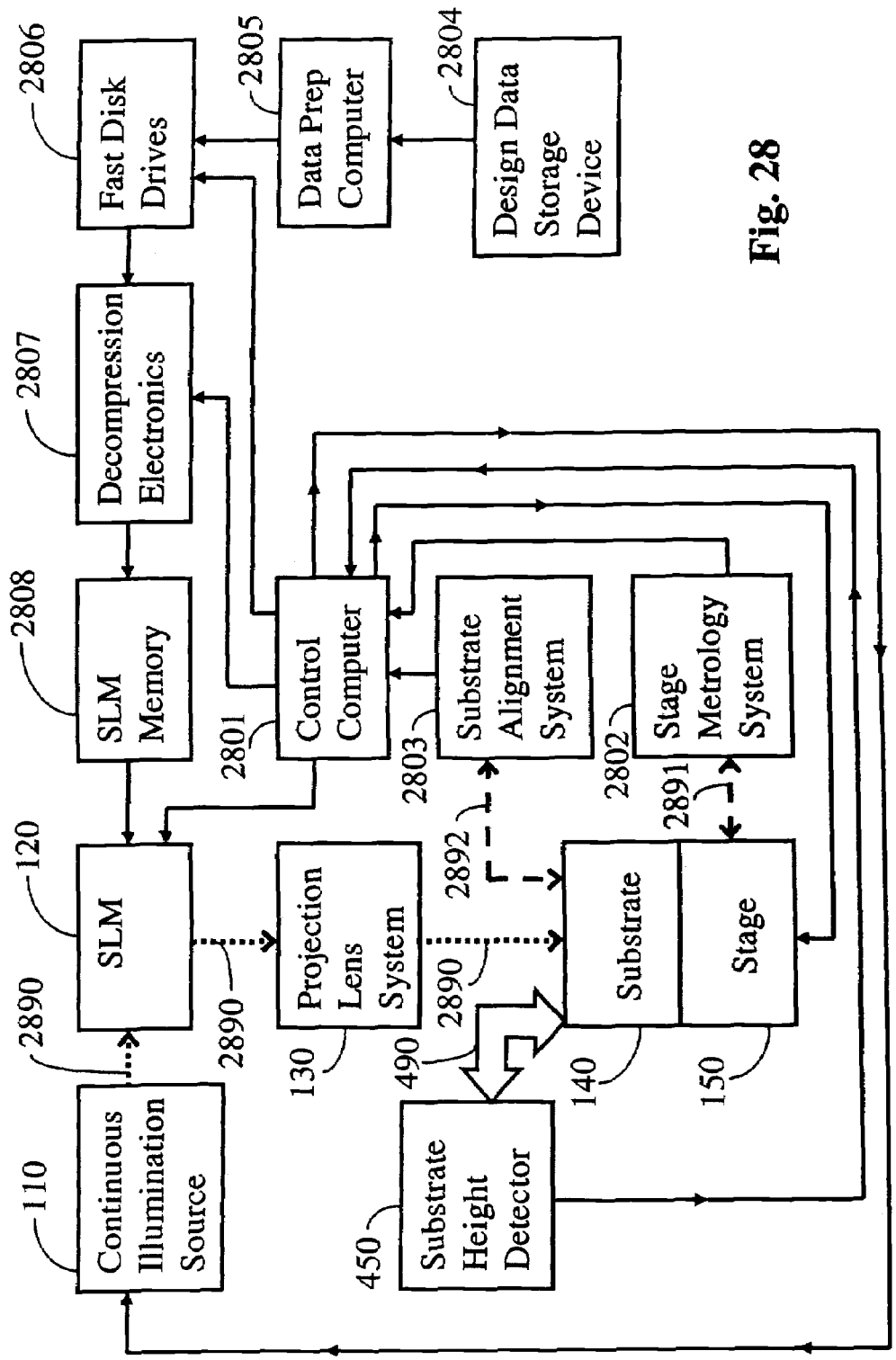
FIG. 28 is a block diagram of an optical lithography system in accordance with the invention.

With reference to FIG. 28, a block diagram for an optical lithography system of the invention is shown. Design data, which resides on the design data storage device 2804, describes what the system should print and is input to the data preparation computer 2805 for translating into a form suitable for the decompression electronics 2807. The data preparation computer 2805 can also modify the data to compensate for previously measured substrate distortion. Substrate alignment system 2803 can be used to measure the substrate distortion. The design data is typically in a CAD (Computer Aided Design) format or a mask standard format such as GDSII. The design data storage device may be one or more tapes or disk drives. The data preparation computer can be any general-purpose computer such as an IBM PC. After computation by the data preparation computer, the data is stored on one or more fast disk drives 2806. The preferred form of this data can be understood by reference to the resultant image in FIG. 19. The entire area of the substrate 140 is divided into small squares with a pitch equal to the magnified pitch of the SLM array 120, substrate array 1002 provides a small-scale example. Each pixel in the array covering the substrate is assigned a dose value that is based on the feature pattern and a look-up table value. The look-up table values are determined experimentally and take into account the distortions and aberrations of projection lens system 130 and the illumination non-uniformity from the illumination source 110. As an example, dose values are derived based on the feature pattern of resultant image 1900, assuming 32 gray levels, where 31 corresponds to 100% exposure. The following pixels will have a dose value of 31:

R1C4, R1C5, R2C2, R2C3, R2C4, R2C5, R3C2, R3C3, R3C4, R3C5

The following will have a dose value of 0:

R1C1, R1C2, R1C3, R1C6, R2C1, R2C6, R3C1, R3C6, R4C1, R4C6

The following pixels will have a dose value intermediate between 0 and 31, based on the intended edge location 1901:

R4C2, R4C3, R4C4, R4C5

For convenience, we will assign a value of 24 to the above. Next, a look-up table is used to modify the dose values to account for distortions, aberrations and illumination nonuniformity of the system. Since the preferred SLM, the Texas Instruments DMD device, can switch mirror states every 102 microseconds and has 1024 rows and 768 columns, this means that the fast disk drives 2806 need to deliver 1 row of 1024 pixels every 102 microseconds. With 32 gray levels this is a data rate of roughly 6.3 megabytes/second. This data rate is easily within present day capabilities of disk drive arrays.

Again referring to FIG. 28, alignment of the substrate 140 to the stage 150 and projection lens system 130 is determined by reflecting substrate alignment system light 2892 off features on the substrate 140 into substrate alignment system 2803. The substrate alignment system is preferably a "machine vision" system that compares arbitrary features on the substrate to previously stored images or idealized images, such as a cross or a circle, in order to find a match. The substrate alignment system light could come from illumination source 110 by way of SLM 120 and projection lens system 130, or from an external source. After reflecting off features on the substrate the light could travel directly to the substrate alignment system, as shown, or could first travel through the projection lens system ("through the lens" alignment). The light reflected off features on the substrate could also travel through the projection lens system, reflect off the SLM and then pass into the substrate alignment system. Stage metrology system 2802 receives stage position information from stage position optical sensor 2891, which can be based on laser interferometers or linear scales, and sends information to control computer 2801. In turn, the control computer sends signals to the stage x, y motors which then servo to the correct location. If edge blurring is accomplished by defocusing, which is the preferred technique, then the control computer commands the stage to servo in z until a suitable gap value is achieved. The gap value is measured by the substrate height detector 450 by way of substrate height detection medium 490, which is preferably air. Other types of detection techniques, such as optical or capacitance, would also work. The gap value (defocus) is chosen to produce the desired amount of feature edge blurring in the image projected onto the substrate. Constant serving to maintain this gap value is needed to compensate for local substrate height variations. Rather than move the stage in the z-direction, it would also be acceptable to move the projection lens system 130 or SLM 120 in the z-direction instead. Next, the control computer commands the fast disk drives 2806 to send the first row of data to the decompression electronics 2807, which loads the first frame of mirror state data to the SLM memory 2808.

To understand the function of the decompression electronics 2807 it is necessary to first understand the requirements of the SLM 120. All of the mirrors in the SLM switch states at the same time. The states of all mirrors are individually determined by values stored in the SLM memory 2808. Therefore, the requirement for the decompression electronics is that it must load the entire SLM memory with new mirror-state values every mirror clock cycle. For the Texas Instruments DMD device, this is every 102 microseconds. The decompression electronics must translate the dose values for each image pixel into a sequence of mirror states that shift with the moving substrate. A simplified example based on FIG. 19 can illustrate how this could be accomplished. For any pixel in the resultant image 1900, 5 dose levels are possible due to the four mirror clock cycles used to shift each row across the mirror section 1000. For example, pixel R4C2 in substrate section 1002 can be exposed at time T4, T5, T6 and T7, as can be seen by inspecting FIG. 19. The actual exposure was only at times T5, T6 and T7 for this pixel. Any of the five possible exposure sequences can be represented by a string of 0's and 1's that correspond to the mirror state at the 4 exposure times. For example, for R4C2 the string would be 0111. A suitable set of 5 exposure sequences would be:

0000 0001 0011 0111 1111

There are other possible sequences that give the same dose, such as 1000 rather than 0001. This degree of freedom can be used to compensate for illumination non-uniformity from illumination source 110. The dose levels that correspond to the exposure sequences are defined to be 0, 1, 2, 3, and 4. Prior to the mirrors switching at time (T4+T3)/2, dose levels for all of the pixels in row 4 (R4) of SLM array 1000 are sent from the fast disk drives 2806 to the decompression electronics 2807. The sequences that correspond to each possible dose level are stored in a look-up table in the decompression electronics. Again using pixel R4C2 as an example, its dose level would be 3 which corresponds to the sequence 0111. Starting in the state shown at T3, the SLM memory 2808 would have a 0 state loaded for the mirror in the fourth row and second column, R4C2, of the substrate array 1000. After the mirrors switch to the state shown at T4, the decompression electronics loads the SLM memory with the second digit in the exposure sequence (1) in the third row and second column, R3C2, of the substrate array 1000. The mirrors switch state at (T5+T4)/2. After the mirrors switch to the state shown at T5, the decompression electronics loads the SLM memory with the third digit in the exposure sequence (1) in the second row and second column, R2C2, of the substrate array 1000. The mirrors switch state at (T6+T5)/2. After the mirrors switch to the state shown at T6, the decompression electronics loads the SLM memory with the fourth digit in the exposure sequence (1) in the first row and second column, R1C2, of the substrate array 1000. The mirrors switch state at (T7+T6)/2. The principal of operation is the same for the much larger Texas Instruments DMD array. The decompression electronics must contain a memory large enough to hold a dose level code for each of the mirrors in the SLM and a look-up table. The decompression electronics also contains logic components to handle the bookkeeping. Because all of the mirror values need to be determined and loaded into the SLM memory during the 102 microseconds mirror clock cycle, many mirror values need to be computed in parallel. For example, if it takes 100 nanoseconds to calculate the next state for a single mirror, then the computations for roughly 800 mirrors must clearly be done in parallel.

The control computer 2801 commands the stage 150 to move to the start location and accelerate to the correct constant speed. Control computer 2801 also commands illumination source 110 to emit light of the correct intensity to match the requirements of photosensitive substrate 140. This is usually done with a variable optical attenuator. Data from the stage metrology system 2802 tells the control computer when the substrate is in the correct position to begin exposure. Again referring to FIG. 19, at time T1 minus T/2, where T satisfies equation (1), the bottom of substrate array 1002 would be at substrate position ½. At this time, the control computer commands the spatial light modulator to switch all of the mirrors to the states corresponding to the new values stored in the SLM memory 2808. At the same time the control computer 2801 commands the fast disk drives 2806 to send the next row of data to the decompression electronics 2807, which loads the second frame of mirror state data into the SLM memory. This process is repeated until the edge of the substrate is reached, at which time the control computer commands the stage to execute a turn-around; the system is then ready to start exposing the next segment of the serpentine path, as shown in FIG. 8. This is repeated until the entire patterned area of the substrate has been exposed.

The method of operation discussed above with reference to FIG. 28 can readily be extended to operate an optical lithography system of the invention comprising multiple SLM area arrays.

Figure 29:
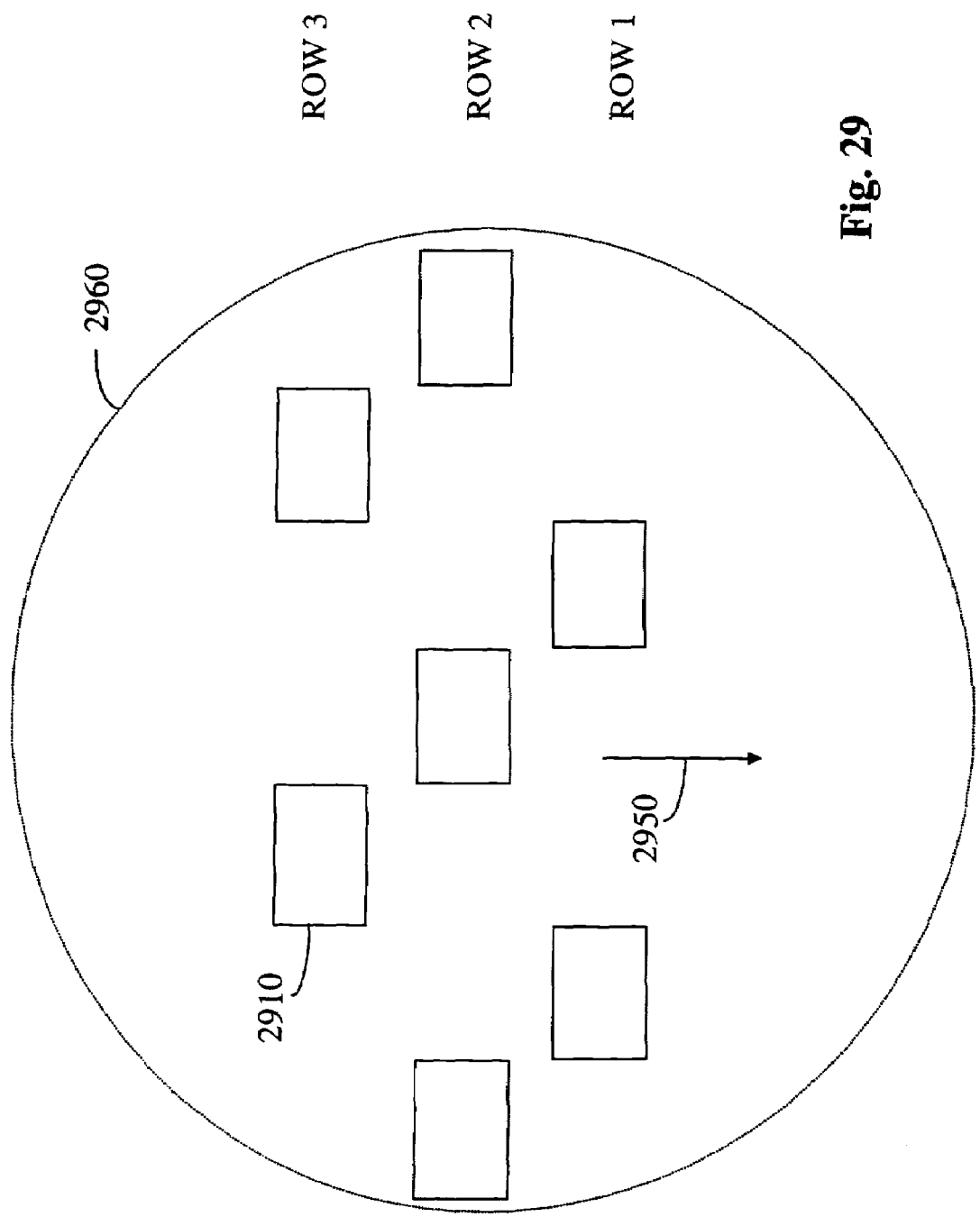
FIG. 29 is a plan view of an arrangement of multiple area arrays in accordance with an embodiment of the invention.

Some embodiments of the optical lithography tool have an SLM with multiple area arrays which are arranged in multiple rows, where all of the following apply: (1) the rows of area arrays are perpendicular to the direction of movement of the projected image of the SLM arrays on the substrate; (2) the area arrays are individually aligned so that the rows of elements in the arrays are also perpendicular to the direction of movement of the projected image of the SLM arrays on the substrate; and (3) the positions of the area arrays are staggered from one row to the next. An example of such an arrangement is shown in FIG. 29. In FIG. 29 the area arrays 2910 are arranged in three rows, where the rows are perpendicular to the direction of movement 2950 of the projected image of the SLM arrays on the substrate (direction 2950 is also the direction in which pattern data is scrolled across the elements of the area arrays). The arrangement of the SLM area arrays shown in FIG. 29 allows a substrate to be exposed without having to follow a serpentine path as shown in FIG. 9 (the path in FIG. 9 is suitable for a single row of SLM area arrays in which there will be gaps between arrays). The staggered arrangement allows the gaps between the arrays in one row to be covered by arrays in other rows. The example shown in FIG. 29 shows coverage without gaps where there is no overlap of coverage in the 3 rows; however, some embodiments may have overlap in coverage. Furthermore the arrangement of SLM area arrays within a roughly circular area (indicated by circle 2960 in FIG. 29) makes efficient use of the imaging optics, which will typically consist of circular components. For example an image of the seven SLM arrays in FIG. 29 can all be simultaneously projected onto a substrate by a projection lens system comprising a single set of circular lenses.

Figure 30:
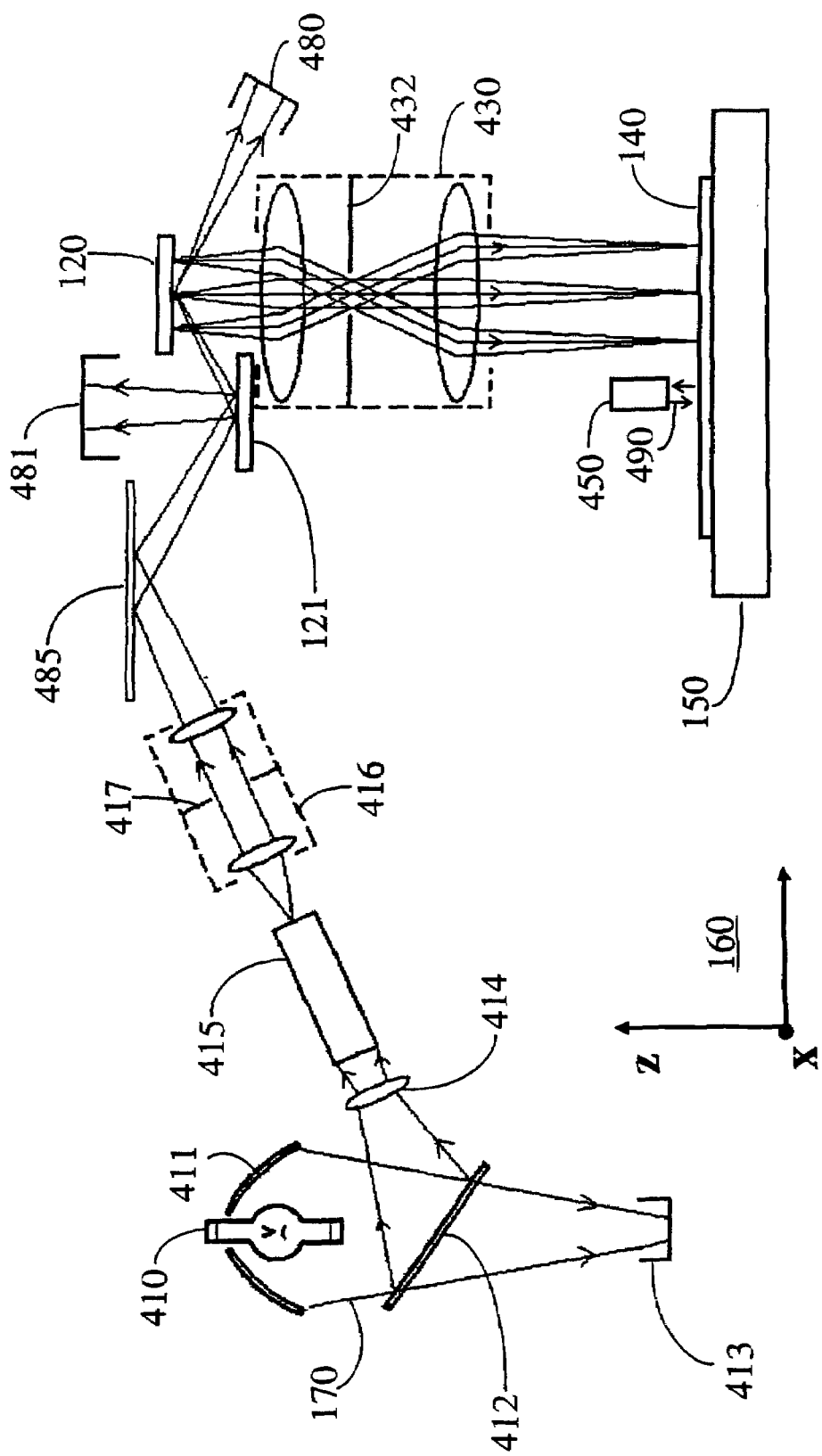
FIG. 30 is a schematic representation of another embodiment of the optical lithography tool of FIG. 4, showing a light switching mechanism 121 on the light path between the light source and the substrate.

FIG. 30 shows the optical lithography tool of FIG. 4 with the addition of a mirror 485, a light switching mechanism 121 and a second SLM beam dump 481. In this example the light switching mechanism 121 is a second SLM. A light path from a light source (comprising components 410 through 417) to a substrate 140, via a SLM 120 is indicated by light rays 170. The light switching mechanism 121 is positioned in serial with the SLM 120 on the light path. In this example, a mirror 485 has also been inserted on the light path to accommodate the SLM 121 in the position shown. Clearly, many other optical configurations are possible that will accommodate the light switching mechanism on the light path between the light source and the SLM 120. The SLM 121 is a mirror array with mirrors that have two states—an "on" state in which the light is reflected toward the SLM 120, and an "off" state in which the mirror reflects light toward second SLM beam dump 481. In this example all of the mirrors are switched as one. A discussion of most of the components of the tool in FIG. 30 can be found in the text relating to FIG. 4. Further explanation of the operation of the tool is given with reference to FIG. 31.

Figure 31:
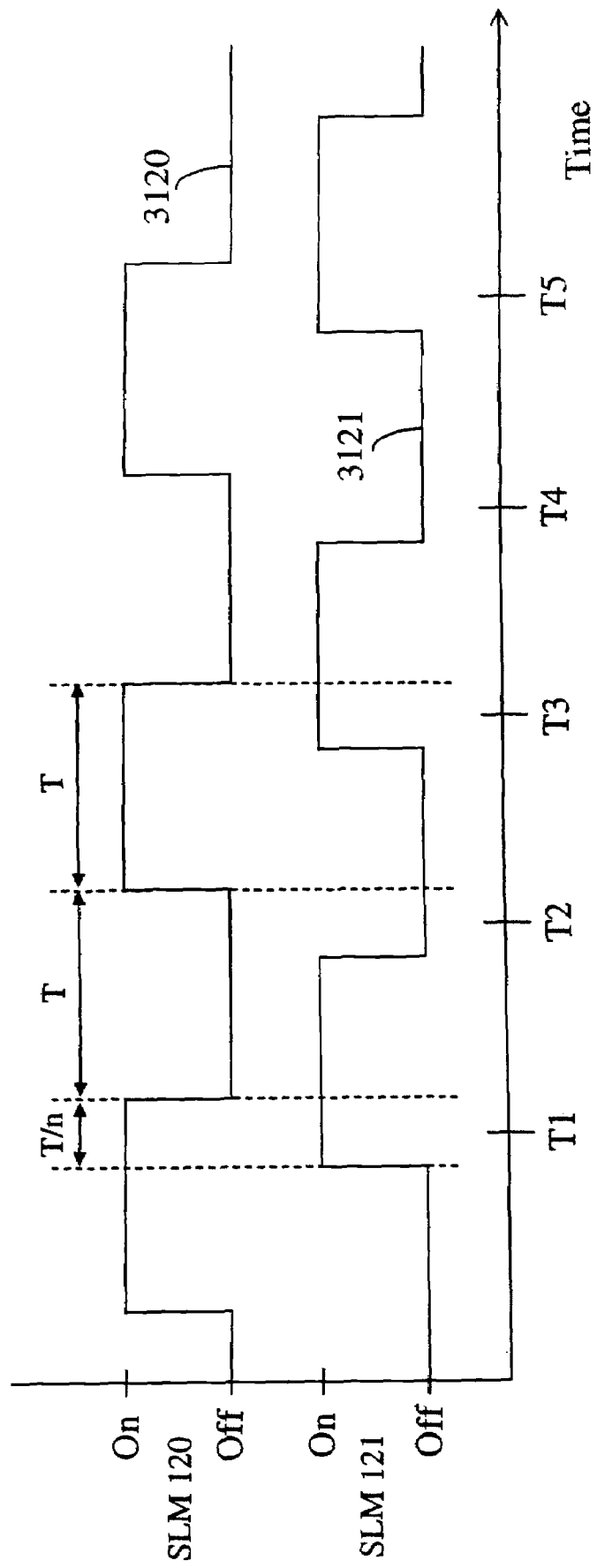
FIG. 31 is a timing diagram of an optical lithography system with two spatial light modulators configured in serial on the light path, in accordance with the invention.

In FIG. 31, the timing of the switching of the SLMs 120 and 121 is shown by waveforms 3120 and 3121, respectively. When SLM 120 is in the "on" state, all of the elements of the SLM may be individually "on" or "off", in other words an exposure pattern may be loaded on the SLM. When the SLM 120 is in the "off" state, all of the elements of the SLM are "off". The same is true for SLM 121, except all of the elements of the SLM are "on" when SLM 121 is in the "on" state. SLMs 120 and 121 have the same time interval T between switching, in other words the same switching frequency; however, they are shifted out of phase by a time shift of $T(1-1/n)$. All elements of both SLMs are switched "off" every other time interval. Only when both SLMs are in the "on" state can light reach the substrate, which is for a time span $T/n$ every other time interval. During this time span the projected image must move across the surface of the substrate a distance of one projected mirror pitch pM (which is the same as one pixel's length on the substrate surface). This results in a stage speed v, given by the equation:

$$v = npM/T \qquad (7)$$

where n is a constant. The time between exposures of the substrate is $2T$, during which time the pattern on the SLM 120 will have shifted by $2n$ rows. In principle n can have any value greater than 1; however, practical choices for n will typically be integers greater than one and less than 10.

Figure 32:
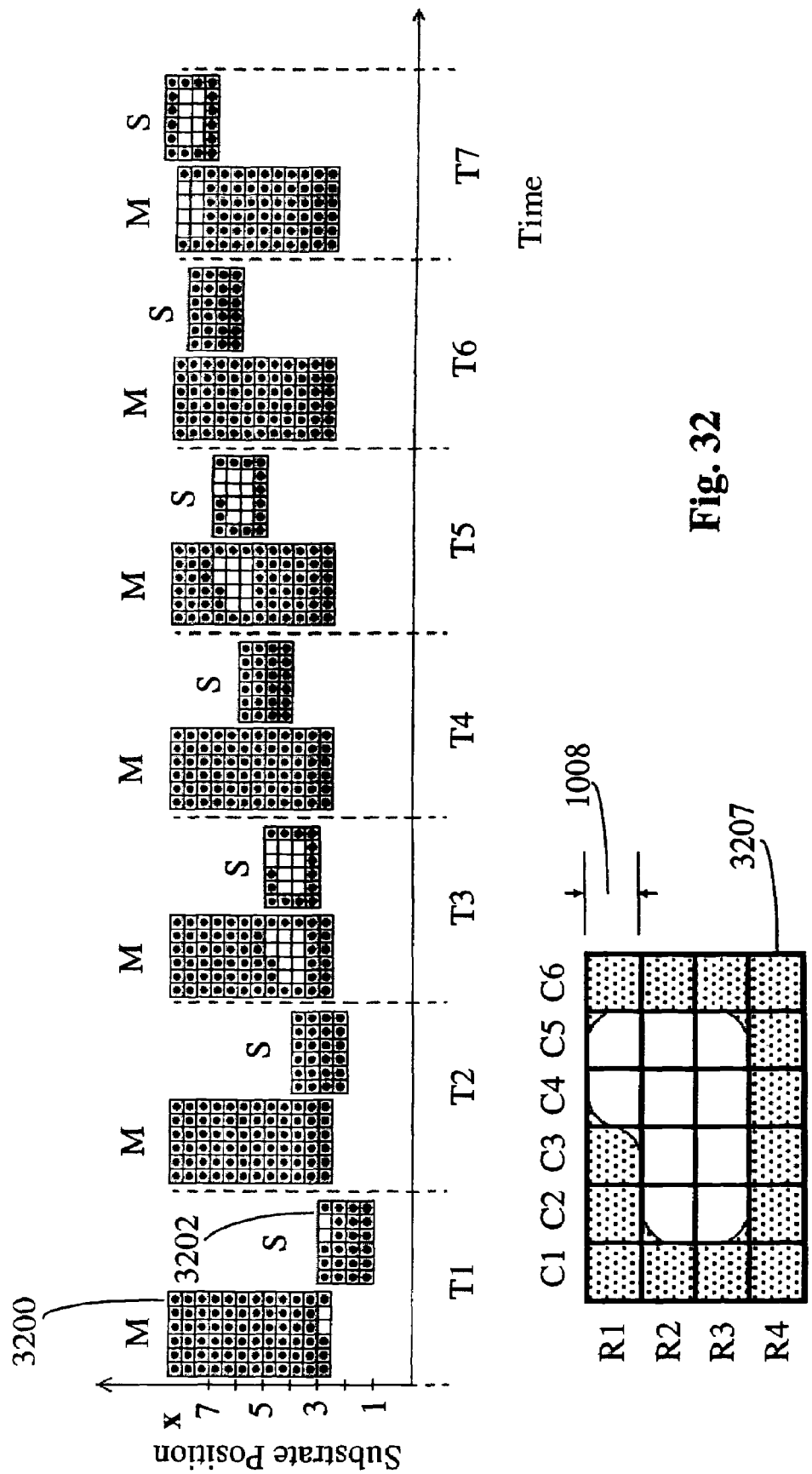
FIG. 32 is a diagrammatic representation of the process of forming a latent image using an optical lithography system with two spatial light modulators configured in serial on the light path, in accordance with the invention.

FIG. 32 illustrates the shifting of patterns on the SLM and the corresponding image on the substrate. In this example, the substrate is on a stage and moves at constant speed in the x direction during exposures. The following are shown, with reference also to FIG. 30: part of SLM 120, which is an array of elements 3200 with an area of 12 rows by 6 columns; a corresponding part of substrate 140, which is an array of pixels 3202 with an area of 4 rows by 6 columns; resultant image 3207 with projected row pitch (width of a pixel) 1008. The resultant image shows one possible latent image on the substrate due to completion of the entire series of exposures. "Snapshots" of the corresponding parts of the SLM and substrate are shown at equally spaced times T1 through T7, where the time interval is T (the times T1 through T5 are also labeled in the timing diagram, FIG. 31, for reference). The parts of the SLM and substrate are indicated in FIG. 32 by M and S, respectively. The SLM array 3200, the substrate array 3202 and the resultant image 3207 are drawn as if viewed from a position directly above them and looking down in the $-z$ direction of stationary coordinate system 160. For ease of illustration, in each "snapshot" the SLM and substrate arrays are shown next to each other. The projected row pitch 1008 in the resultant image is the row pitch in the SLM array 3200 times the magnification of the projection lens system 430. However, for ease of illustration, in each "snapshot" the SLM and substrate arrays are shown having the same size and orientation. The grid shown on the arrays 3200 and 3202, and the image 3207 is for reference only. A light square in 3200 corresponds to an SLM element in the "on" state, while a dark square corresponds to one in the "off" state. The light and dark areas in 3202 correspond to the states of the SLM elements for that "snapshot". The example shown in FIG. 32 is for n=2. An exposure is made every $2T$ and the pattern on the SLM array is seen to have moved by 4 rows during this time period. The resultant image is the same as seen in FIG. 10, even though the substrate in FIG. 32 was moving twice as fast during exposure.

The approach described above with reference to FIGS. 30 through 32 is an example of how to increase the throughput of substrates, without having to reduce the switching time of the SLM. This is important when the minimum switching time for the SLM is already being used, since the throughput of substrates can still be increased. The cost of this increase in throughput is a more complex lithography tool, including a light switching mechanism and an SLM with a larger number of rows (to accommodate the movement of 2 n rows between exposures).

Clearly, the tool of FIG. 30 can be used to implement gray level techniques, as described previously. The tool of FIG. 30 can be modified and operated in many ways, as described earlier for the tools of FIGS. 1 through 6. For example a variety of image movement mechanisms, as shown in FIGS. 2 and 3, can be integrated into the tool of FIG. 30.

The light switching mechanism 121 in FIG. 30 can clearly be effective in different positions, both in front of and beyond the SLM 120 on the light path, providing appropriate optical adjustments are made. The light switching mechanism may be integrated into the light source, and may even be an intrinsic property of the light source (for example a pulsed laser). The light switching mechanism can be a SLM, a shutter, a rotating mirror, or any other optical component capable of controlling the passage of light along the light path. Those skilled in the art will be aware of the many ways in which these light switching mechanisms can be incorporated and used in the many embodiments of the optical lithography tool of the invention. For example, the addition of some lenses between the SLM 121 and SLM 120 shown in FIG. 30 would allow an image of the pixels of SLM 121 to be focused, in one-to-one correspondence, onto the pixels of SLM 120—this would allow the SLM 121 to be used to control the passage of light independently for different blocks of array elements or even to control the passage of light on an individual element basis.

Figure 33:
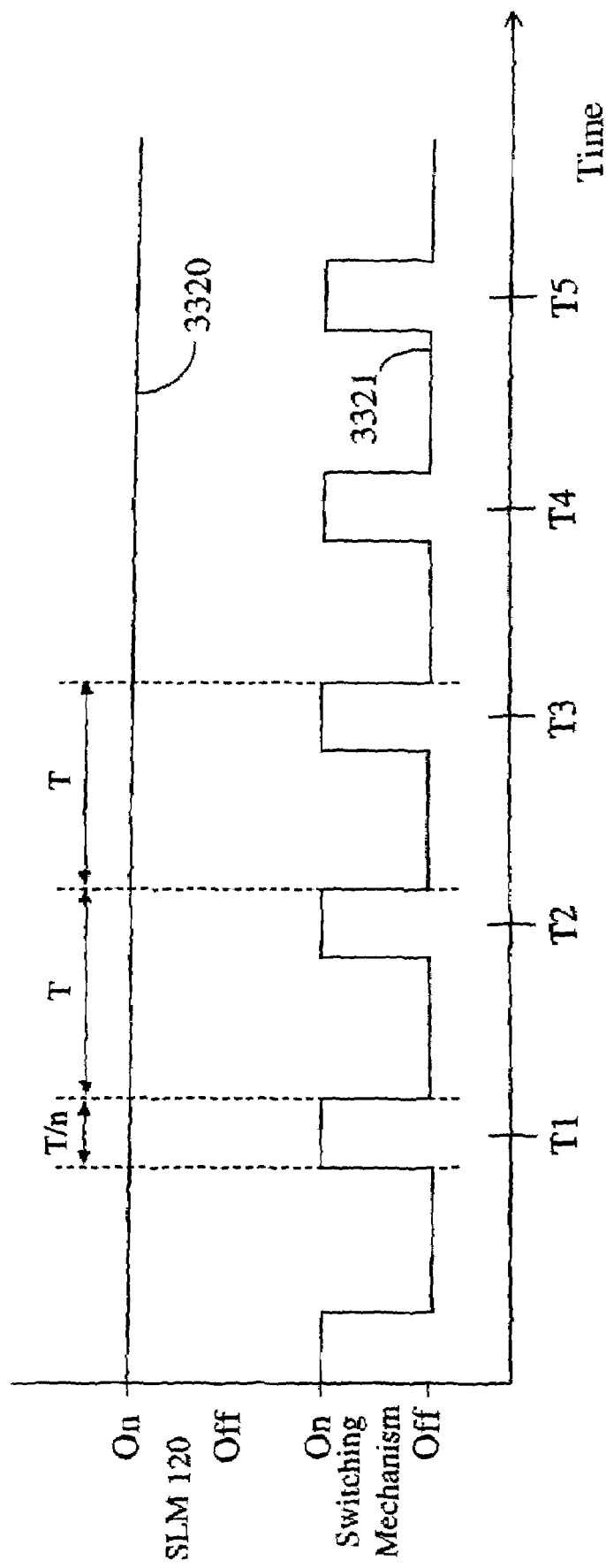
FIG. 33 is a timing diagram of an optical lithography system with a spatial light modulator and a light switching mechanism configured in serial on the light path, in accordance with the invention.

Now to consider the case in which the light switching mechanism can be switched faster than the SLM 120. In FIG. 33, the timing of the switching of the SLM 120 and the light switching mechanism is shown by waveforms 3320 and 3321, respectively. When SLM 120 is in the "on" state, all of the elements of the SLM may be individually "on" or "off", in other words an exposure pattern may be loaded on the SLM. When the SLM 120 is in the "off" state, all of the elements of the SLM are "off". The pattern on the SLM can be switched every time interval T. The light switching mechanism is configured as a simple two state "on"/"off" switch. Only when both the SLM and the light switching mechanism are in the "on" state can light reach the substrate. The light switching mechanism provides the limiting time span T/n during which light can reach the substrate. During this time span the projected image must move across the surface of the substrate a distance of one projected mirror pitch pM (which is the same as one pixel's length on the substrate surface). This results in a stage speed v, given by equation (7). The time between exposures of the substrate is T, during which time the pattern on the SLM 120 will have shifted by n rows. In principle n can have any value greater than 1; however, practical choices for n will typically be integers greater than one and less than 20, in which case the time span will be a submultiple of said switching time interval.

Figure 34:
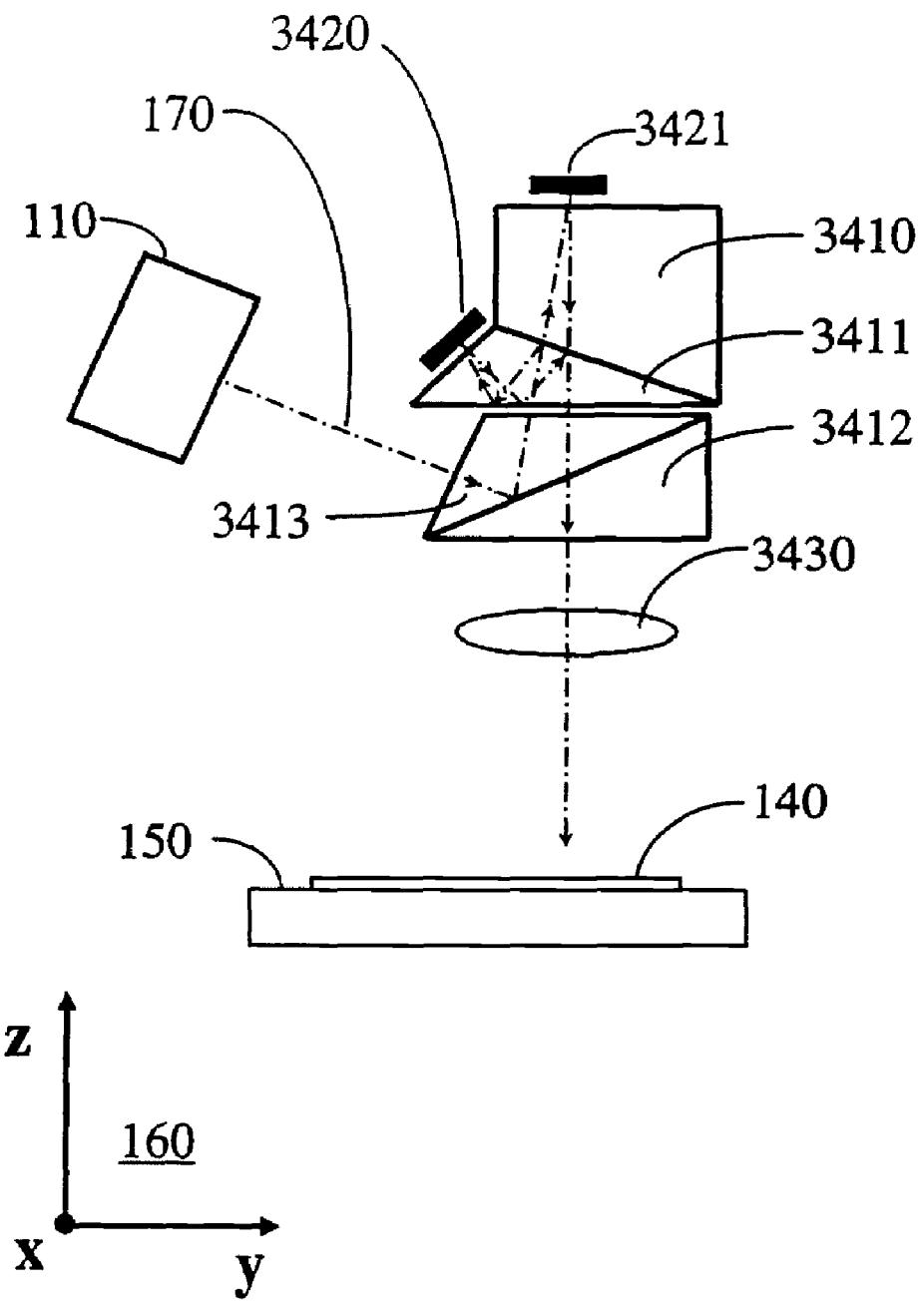
FIG. 34 is a schematic representation of an optical lithography tool with light optics configured to overlap projected images of two area arrays on the substrate surface, in accordance with the invention.

FIG. 34 shows an optical lithography tool with optics configured to allow the projected images from two SLM area arrays, 3420 and 3421, to overlap on the surface of a substrate. If desired, the overlapping images may be brought into register—superimposed exactly, pixel for pixel. A light source 110 and prisms 3410 through 3413 provide illumination to two SLM area arrays 3420 and 3421. The light reflected from the SLM area arrays is combined by prisms 3410 through 3413 and to then projected by imaging optics 3430 onto the photosensitive surface of a substrate 140. The substrate 140 is carried by a stage 150 which moves the substrate in the x-y plane of coordinate axes 160. The optical configuration of FIG. 34 may be modified to include more SLM area arrays. An example of an optical configuration allowing for the projected images of three SLM area arrays to overlap on the surface of a substrate is shown in U.S. Pat. No. 6,582,080 to Gibbon et al., incorporated by reference herein. Those skilled in the art will appreciate that the tool shown in FIG. 34 may be modified along the lines of the apparatus shown in FIGS. 1 through 6, thus providing many further embodiments of the invention. The apparatus of FIG. 34 can be operated in a similar manner to that of FIG. 30. Further explanation of the operation of the tool is given with reference to FIG. 35.

Figure 35:
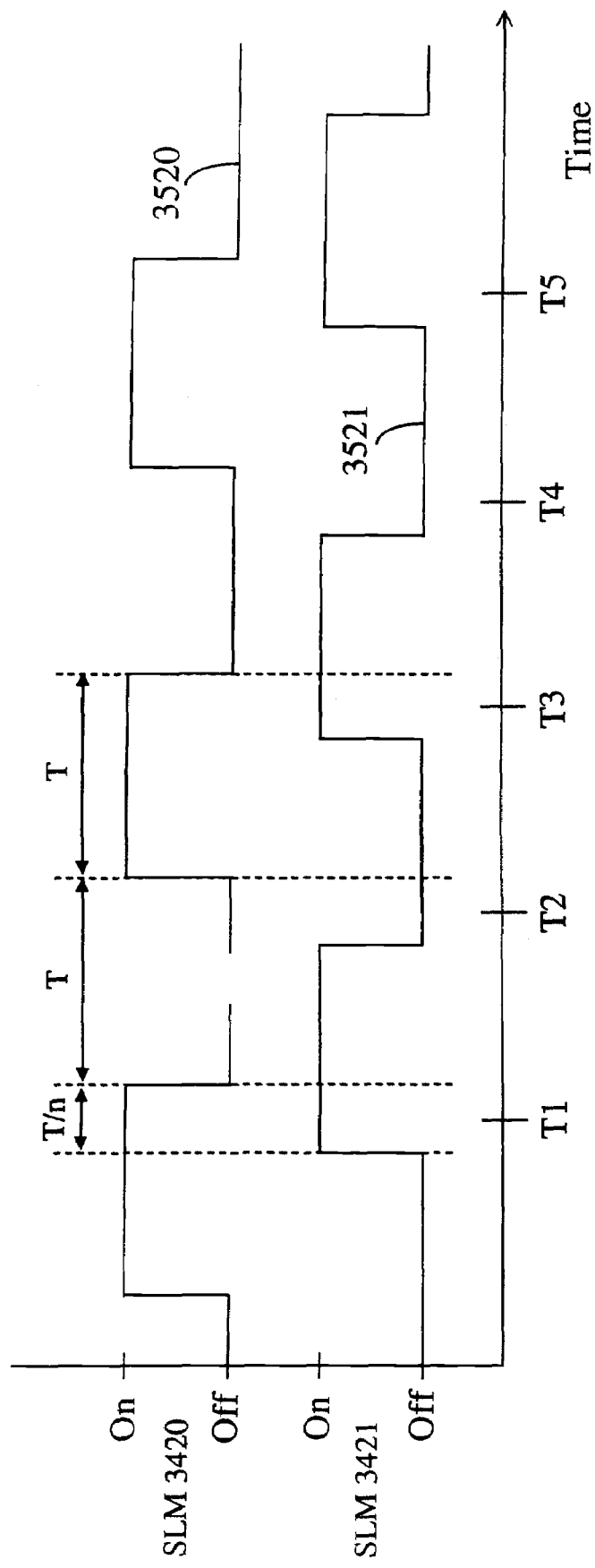
FIG. 35 is a timing diagram of the optical lithography system of FIG. 34.

In FIG. 35, the timing of the switching of the area arrays 3420 and 3421 is shown by waveforms 3520 and 3521, respectively. When array 3420 is in the "on" state, all of the elements of the array may be individually "on" or "off", in other words an exposure pattern may be loaded on the array. When the array 3420 is in the "off" state, all of the elements of the array are "off". The same is true for array 3421. Arrays 3420 and 3421 have the same time interval T between switching, in other words the same switching frequency; however, they are shifted out of phase by a time shift of T(1-1/n). All elements of both arrays are switched "off" every other time interval. Both area arrays are in the "on" state and a double dose of light reaches the substrate for a time span T/n every other time interval. During this time span the projected image must move across the surface of the substrate a distance of one projected mirror pitch pM (which is the same as one pixel's length on the substrate surface). This results in a stage speed v, given by equation (7). The time between double dose exposures of the substrate is 2 T, during which time the pattern on the SLM 120 will have shifted by 2 n rows. Adjustment of the dose and development conditions of the photosensitive surface of the substrate are made to ensure that only pixels which have received sufficient double dose exposures will form the developed pattern.

Clearly, the tool of FIG. 34 can be used to implement gray level techniques, as described previously. The tool of FIG. 34 can be modified and operated in many ways, as described earlier for the tools of FIGS. 1 through 6 and 30. For example a variety of image movement mechanisms, as shown in FIGS. 2 and 3, can be integrated into the tool of FIG. 34.

An alternative mode of operation for the optical lithography tool of FIG. 34 is to have the area arrays 3420 and 3421 operating in phase. In this case the speed of the substrate will be limited by equation (1). This mode of operation may be useful when a single area array is unable to deliver a large enough dose per unit time.

Referring to the description of FIGS. 8 and 9, an SLM area array is oriented in such a way that the columns of pixels in the projected image on the substrate are parallel to the direction of movement of the image itself. This results in blurring of the edges of the pixels which are orthogonal to the direction of movement; however, the edges parallel to the direction of movement are not blurred by the movement. In order to implement gray level techniques, the edges parallel to the direction of movement must also be blurred. Blurring of the parallel edges can be achieved in many ways as described earlier, all of which involve projecting a blurred image of the SLM onto the substrate surface. There is an alternative approach to achieving blurred edges which can be used with all of the embodiments of the optical lithography tool disclosed above—the SLM area array is oriented in such a way that the columns of pixels in the projected image on the substrate are not parallel to the direction of movement of the image itself. For example, the columns in the projected image may be at an angle of 45 degrees to the direction of movement, in which case all of the edges of the square pixels will be equally blurred due to the movement alone.

While the invention has been described with reference to particular embodiments, this description is solely for the purpose of illustration and is not to be construed as limiting the scope of the invention claimed below.

What is claimed is:

1. A lithographic tool, comprising:
a spatial light modulator, said spatial light modulator comprising an area array of individually switchable elements, said elements of said spatial light modulator being arranged in rows and columns on a rectangular grid;
a light source configured to continuously illuminate said spatial light modulator;
imaging optics configured to continuously project an image of said spatial light modulator on a photosensitive material, said photosensitive material comprising an area array of pixels, the size and configuration of said pixels corresponding to the projected spacing and configuration of individually switchable elements in said spatial light modulator, wherein said photosensitive material coats the surface of a substrate;
a control system configured to control switching of said individually switchable elements of said spatial light modulator for defining features in said photosensitive material, said switching being between at least two states, wherein a first state allows light to reach said photosensitive material and a second state stops light from reaching said photosensitive material; and
a stage configured to move said substrate relative to said projected image, whereby a pixel in said photosensitive material receives, in serial, doses of energy from multiple elements of said spatial light modulator;
wherein the direction of movement of said substrate is neither parallel nor orthogonal to said columns of said elements of said spatial light modulator and wherein said control system is further configured to control switching of said elements of said spatial light modulator to vary the number of elements of said spatial light modulator that serially contribute to a total dose of energy received by any pixel in said photosensitive material, whereby some pixels in said photosensitive material receive different, non-zero, total doses of energy.

2. A lithographic tool as in claim 1, wherein said direction of movement of said substrate is at 45 degrees to said columns of said elements of said spatial light modulator.

3. A lithographic tool as in claim 1, wherein feature edges in said photosensitive material are shifted by a sub-pixel distance from the pixel edges defined by said area array in said photosensitive material.

4. A lithographic tool as in claim 1, wherein said light source is a lamp system comprising an arc lamp.

5. A lithographic tool as in claim 4, wherein said lamp system further comprises a light pipe positioned between said arc lamp and said spatial light modulator.

6. A lithographic tool as in claim 4, wherein said lamp system further comprises a fly's eye lens array positioned between said arc lamp and said spatial light modulator.

7. A lithographic tool as in claim 1, wherein said light source is a quasi-continuous laser.

8. A lithographic tool as in claim 1, wherein said spatial light modulator is a digital micro-mirror device.

9. A lithographic tool as in claim 1, wherein said correspondence of said pixels to said individually switchable elements in said spatial light modulator is one-to-one.

10. A lithographic tool as in claim 1, further comprising:
a data preparation computer; and
decompression electronics;
wherein said data preparation computer is configured to modify a design data file into a form suitable for said decompression electronics and said decompression electronics is configured to translate said modified design data into a matrix of values representing said states for each of said elements of said spatial light modulator.

11. A lithographic tool as in claim 1, further comprising a substrate alignment system, said substrate alignment system being configured to align said substrate to said imaging optics.

12. A lithographic tool as in claim 11, wherein said substrate alignment system is a machine vision system, said machine vision system being configured to compare arbitrary features on said substrate to images previously stored in a memory device.

13. A lithographic tool as in claim 11, wherein said substrate alignment system is a machine vision system, said machine vision system being configured to compare arbitrary features on said substrate to idealized images previously stored in a memory device.

14. A lithographic tool as in claim 13, wherein said idealized images are selected from the group consisting of a cross and a circle.

15. A lithographic tool as in claim 11, wherein said substrate alignment system is further configured to measure the distortion of said substrate.

16. A lithographic tool as in claim 15, further comprising:
a data preparation computer; and
decompression electronics;
wherein said data preparation computer is configured to (1) modify a design data file into a form suitable for said decompression electronics and (2) modify said design data to compensate for said distortion of said substrate, and wherein said decompression electronics is configured to translate said modified design data into a matrix of values representing said states for each of said elements of said spatial light modulator.

17. A lithographic tool, comprising:
a spatial light modulator, said spatial light modulator comprising an area array of individually switchable elements;
a light source configured to continuously illuminate said spatial light modulator;
imaging optics configured to project an image of said spatial light modulator on a photosensitive material, said photosensitive material comprising an area array of pixels, the size and configuration of said pixels corresponding to the projected spacing and configuration of individually switchable elements in said spatial light modulator;
a control system configured to control switching of said individually switchable elements of said spatial light modulator for defining features in said photosensitive material, said switching being between at least two states, wherein a first state allows light to reach said photosensitive material and a second state stops light from reaching said photosensitive material; and a stage configured to move said substrate relative to said projected image, whereby a pixel in said photosensitive material receives, in serial, doses of energy from multiple elements of said spatial light modulator;

wherein said stage and said imaging optics are further configured to provide a defocused image of said spatial light modulator on said photosensitive material, and wherein said control system is further configured to control switching of said elements of said spatial light modulator to vary the number of elements of said spatial light modulator that serially contribute to the total dose of energy received by any pixel in said photosensitive material, whereby some pixels in said photosensitive material receive different, non-zero, total doses of energy.

18. A lithographic tool as in claim 17, further comprising a gap measuring system configured to monitor the distance between said imaging optics and said photosensitive material coating said substrate.

19. A lithographic tool as in claim 18, further comprising a gap control system for keeping the distance between said photosensitive material and said imaging optics constant, whereby a desired defocus is maintained.

20. A lithographic tool, comprising:

a spatial light modulator, said spatial light modulator comprising an area array of individually switchable elements;

a light source configured to continuously illuminate said spatial light modulator;

imaging optics configured to project an image of said spatial light modulator on a photosensitive material, said photosensitive material comprising an area array of pixels, the size and configuration of said pixels corresponding to the projected spacing and configuration of individually switchable elements in said spatial light modulator, wherein said photosensitive material coats the surface of a substrate;

a control system configured to control switching of said individually switchable elements of said spatial light modulator for defining features in said photosensitive material, said switching being between at least two states, wherein a first state allows light to reach said photosensitive material and a second state stops light from reaching said photosensitive material; and a stage configured to move said substrate relative to said projected image, whereby a pixel in said photosensitive material receives, in serial, doses of energy from multiple elements of said spatial light modulator;

wherein said imaging optics is further configured to project a blurred image of said spatial light modulator on said photosensitive material, and wherein said control system is further configured to control switching of said elements of said spatial light modulator to vary the number of elements of said spatial light modulator that serially contribute to the total dose of energy received by any pixel in said photosensitive coating, whereby some pixels in said photosensitive material receive different, non-zero, total doses of energy.

21. A lithographic tool as in claim 20, wherein said imaging optics comprises a diffuser configured to blur said image of said spatial light modulator.

22. A lithographic tool as in claim 20, wherein said imaging optics has a numerical aperture adjusted such that said image of said spatial light modulator is blurred.

23. A lithographic tool as in claim 20, wherein said imaging optics comprises a microlens array configured to blur said image of said spatial light modulator.

24. A lithographic tool as in claim 20, wherein said elements of said spatial light modulator are arranged in rows and columns on a rectangular grid and wherein the direction of movement of said substrate is parallel to said columns of said elements of said spatial light modulator.

* * * * *

UNITED STATES PATENT AND TRADEMARK OFFICE
CERTIFICATE OF CORRECTION

PATENT NO.         : 7,639,416 B2                                              Page 1 of 1
APPLICATION NO. : 11/923399
DATED              : December 29, 2009
INVENTOR(S)        : William Daniel Meisburger It is certified that error appears in the above-identified patent and that said Letters Patent is hereby corrected as shown below:

Column 13, line 28, "... for the substrate at rest, $I_w$, by:" should read --... for the substrate at rest, I, by:--.

Column 13, Equation (5):

$$D(x) = N\left[\int_0^{T/2} I_0(x+vt)dt + \int_{T/2}^{T} I_0(x+vt+vT)dt\right] \quad (5)$$

should be written as:

$$D(x) = N\left[\int_0^{T/2} I_0(x+vt)dt + \int_{T/2}^{T} I_0(x+vt-vT)dt\right] \quad (5)$$

Column 17, line 56 reads: "KL, MN, OP, OR and ST..."
should read: --... KL, MN, OP, QR and ST ...--.

Column 18, line 2, "KL, MN, OP, OR and ST, respectively; ..."
should read: --KL, MN, OP, QR and ST, respectively;--.

Column 18, lines 9 and 10, "... MN, OP, OR and ST extend ..." should read --... MN, OP, QR and ST extend ...--.

Column 19, line 53 "... Constant serving to maintain this gap value..."
should read --... Constant servoing to maintain this gap value ...--.

Signed and Sealed this

Twentieth Day of April, 2010

David J. Kappos
*Director of the United States Patent and Trademark Office*